United States Patent
Moreno et al.

(10) Patent No.: US 11,751,365 B2
(45) Date of Patent: Sep. 5, 2023

(54) JET IMPINGEMENT MANIFOLDS FOR COOLING POWER ELECTRONICS MODULES

(71) Applicant: Alliance for Sustainable Energy, LLC, Golden, CO (US)

(72) Inventors: Gilberto Moreno, Thornton, CO (US); Sreekant Venkat Jagannath Narumanchi, Littleton, CO (US); Kevin Scott Bennion, Littleton, CO (US); Ramchandra Mahendrabhai Kotecha, Lakewood, CO (US); Paul Philip Paret, Thornton, CO (US); Xuhui Feng, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 321 days.

(21) Appl. No.: 17/084,236

(22) Filed: Oct. 29, 2020

(65) Prior Publication Data
US 2021/0212242 A1 Jul. 8, 2021

Related U.S. Application Data

(60) Provisional application No. 63/062,791, filed on Aug. 7, 2020, provisional application No. 62/927,252, filed on Oct. 29, 2019.

(51) Int. Cl.
*H05K 7/20* (2006.01)
*F28F 3/12* (2006.01)

(52) U.S. Cl.
CPC .......... *H05K 7/20927* (2013.01); *F28F 3/12* (2013.01); *H05K 7/20272* (2013.01)

(58) Field of Classification Search
CPC ... F28F 3/12; H05K 7/20236; H05K 7/20254; H05K 7/20272; H05K 7/203; H05K 7/20327; H05K 7/20872; H05K 7/20927
See application file for complete search history.

(56) References Cited

U.S. PATENT DOCUMENTS

| | | | |
|---|---|---|---|
| 7,190,580 B2 * | 3/2007 | Bezama | F28F 13/06 174/15.1 |
| 8,699,225 B2 | 4/2014 | Brandenburg et al. | |
| 9,437,523 B2 | 9/2016 | Joshi et al. | |
| 9,445,526 B2 | 9/2016 | Zhou et al. | |
| 9,980,415 B2 | 5/2018 | Zhou et al. | |
| 10,270,220 B1 | 4/2019 | Eppich et al. | |
| 10,278,305 B2 | 4/2019 | Roan et al. | |
| 2005/0072177 A1 | 4/2005 | Hale et al. | |
| 2005/0139996 A1 * | 6/2005 | Myers | H01L 23/473 257/784 |

(Continued)

OTHER PUBLICATIONS

Moreno et al., "Ga2O3 Packaging and Thermal Management Challenges and Opportunities", Third Ultrawide-Bandgap Workshop, Adelphi, Maryland, May 14-16, 2019, NREL/PR-5400-73902, pp. 1-19.

(Continued)

*Primary Examiner* — Jacob R Crum
(74) *Attorney, Agent, or Firm* — Alexandra M. Hall

(57) ABSTRACT

The present disclosure describes techniques for cooling power electronics in automotive applications. The present disclosure utilizes a jet impingement of a dielectric fluid on electrical interconnections to cool power electronics.

11 Claims, 23 Drawing Sheets

(56) References Cited

U.S. PATENT DOCUMENTS

| | | | |
|---|---|---|---|
| 2005/0211427 A1* | 9/2005 | Kenny | F28D 15/0266 |
| | | | 165/299 |
| 2008/0190586 A1* | 8/2008 | Robinson | H01L 23/4735 |
| | | | 361/689 |
| 2008/0210405 A1* | 9/2008 | Datta | F28D 15/0266 |
| | | | 257/E23.098 |
| 2012/0063091 A1* | 3/2012 | Dede | H05K 7/20927 |
| | | | 174/15.1 |
| 2018/0279508 A1 | 9/2018 | Roan et al. | |
| 2021/0138487 A1* | 5/2021 | Bobusch | B05B 1/08 |

OTHER PUBLICATIONS

Schnur et al., "Design and Fabrication of PCB Embedded Power Module with Integrated Heat Exchanger for Dielectric Coolant", CIPS 2018, 10th International Conference on Integrated Power Electronics Systems, Mar. 20-22, 2018, pp. 400-405.

Moreno , "Power Electronics Thermal Management—Keystone Project 1", 2019 Annual Merit Review and Peer Evaluation Meeting, DOE Vehicle Technologies Office, Jun. 11, 2019, pp. 1-25.

Moreno , "Power Electronics Thermal Management—Keystone Project 1", 2019 Annual Merit Review and Peer Evaluation Meeting, DOE Vehicle Technologies Office, Jun. 11, 2019, pp. 1-22.

\* cited by examiner

JET IMPINGEMENT MANIFOLDS FOR COOLING POWER ELECTRONICS MODULES

CROSS-REFERENCE TO RELATED APPLICATIONS

This application claims priority from U.S. Provisional Patent Application Nos. 62/927,252 and 63/062,791 filed on Oct. 29, 2019 and Aug. 7, 2020, respectively, the contents of which are incorporated by reference in their entirety.

CONTRACTUAL ORIGIN

This invention was made with government support under Contract No. DE-AC36-08GO28308 awarded by the U.S. Department of Energy. The United States government has certain rights in this invention.

SUMMARY

An aspect of the present disclosure is a device including a block comprising a length in the x-axis direction, a width in the y-axis direction, and a height in the z-axis direction; a first channel comprising a first opening; a second channel comprising a second opening and a third opening; and a fourth opening; in which the length and the width define a first surface and a second surface of the block, the length and the height define a third surface and a fourth surface of the block, the width and the height define a fifth surface and a sixth surface of the block, the first channel is positioned within the first surface and penetrates the block in the x-axis direction to a first depth, and penetrates the block in the z-axis direction to a second depth, the second channel is positioned within the second surface, passes through the block from the third surface to the fourth surface, and penetrates the block in the z-axis direction to a third depth, the fourth opening is configured to connect the first channel and the second channel, the first channel is configured to direct a fluid from the first opening to the fourth opening, and the second opening and the third opening are configured to receive the fluid from the fourth opening. In some embodiments, the first depth is less than the length of the block, the first channel terminates at the first depth at a second width, the first channel has a third width in the y-axis direction at the first opening, and the second width of the first channel is less than the third width of the first channel. In some embodiments, the device also includes a plate positioned within the second channel, in which the plate comprises a second height and a second width defining a plane, the plane is positioned substantially parallel to the third surface, the width of the plate is substantially equal to the width of the block, and the height of the plate is substantially equal to the third depth. In some embodiments, the fourth opening comprises two or more openings aligned in series along the x-axis. In some embodiments, the first channel has a cross-sectional shape in a plane substantially parallel to the first surface that is substantially triangular. In some embodiments, the first depth is between 10 and 70 mm. In some embodiments, the second depth is between 1 and 5 mm. In some embodiments, the third depth is between 3 and 5 mm. In some embodiments, the width (W) and the height (H) form an aspect ratio W/H between 1 and 1.5. In some embodiments, the width (W) and the length (L) form an aspect ratio L/W between 2 and 5. In some embodiments, the block is constructed of at least one of plastic, ceramic, aluminum, and/or stainless steel.

A second aspect of the present disclosure is a system including a first block; a housing configured to contain the first block and to receive and discharge a fluid, the housing including an inlet configured to receive the fluid and direct the fluid to the block through a first channel; and an outlet configured to receive the fluid from the block through a second channel; in which the block is configured to direct the fluid to a surface of a power electronics module. In some embodiments, the system also includes a second block; and a fifth channel; in which the power electronics module is configured to be positioned between the first block and the second block, the power electronics module comprises a first electrical conductor and a second electrical conductor is positioned between the first block and the second block; the fifth channel is substantially parallel to the first channel; the first electrical conductor extends into the first channel, and the first electrical conductor is configured to contact the fluid in the first channel. In some embodiments, the first block and the second block include a length in the x-axis direction, a width in the y-axis direction, and a height in the z-axis direction; a third channel comprising a first opening; a fourth channel comprising a second opening and a third opening; and a fourth opening; in which the length and the width define a first surface and a second surface of the block, the length and the height define a third surface and a fourth surface of the block, the width and the height define a fifth surface and a sixth surface of the block, the third channel is positioned within the first surface and penetrates the block in the x-axis direction to a first depth, and penetrates the block in the z-axis direction to a second depth, the fourth channel is positioned within the second surface, passes through the block from the third surface to the fourth surface, and penetrates the block in the z-axis direction to a third depth, the fourth opening is configured to connect the third channel and the fourth channel, the third channel is configured to direct a fluid from the first opening to the fourth opening, and the second opening and the third opening are configured to receive the fluid from the fourth opening, the fluid is configured to impinge on the first plate through the fourth opening of the first block; the fluid is configured to impinge on the second plate through the fourth opening of the second block In some embodiments, the system also includes a first drainage channel configured to accept the fluid from the fourth channel of the first block; a second drainage channel configured to accept the fluid from the fourth channel of the second block. In some embodiments, the first block is oriented such that the first opening is connected to the first channel, and the second block is oriented such that the first opening is connected to the fifth channel. In some embodiments, the fluid is configured to flow from the inlet to the first channel and the second channel, the fluid is configured to enter the first opening of the first block and the second block and impinge on the first plate and the second plate, and the fluid is configured to exit the first block and the second block to the fifth channel. In some embodiments, the first block is oriented such that the first opening connected to the first channel, and the second block is oriented such that the first opening is connected to the second channel. In some embodiments, the fluid is configured to flow from the inlet to the first channel, enter the first opening of the first block and impinge on the first plate, exit the first drainage channel to the second channel, enter the first opening of the second block and impinge on the second plate, exit the second drainage channel to the fifth channel, and flow from the fifth channel to the outlet. In some embodiments, the fluid is a dielectric fluid, wherein the dielectric fluid comprises an automotive transmission fluid, a driveline fluid, a hydraulic fluid, or a motor oil.

BACKGROUND

The size, weight, and cost of power electronic components are key factors that influence the cost of hybrid and electric vehicles. According to a report from the Oak Ridge National Laboratory, power electronics accounts for up to 40% of the total traction drive cost in hybrid vehicles. Increasing vehicle electrification, reducing the use of petroleum, requires making electric drive vehicles cost competitive with conventional gasoline powered vehicles. One means of reducing the cost of hybrid and electric vehicles is through reduced cost, weight, and size of automotive power electronics.

However, heat dissipation is a limiting factor in reducing the size and cost of the power electronics components of vehicles. Current power electronics are sized larger to spread heat and thus allow for reliable operation. Increasing the heat dissipation using highly efficient cooling schemes would allow for greater power density (heat per volume), which could in turn reduce the size, weight, and cost of power electronics.

BRIEF DESCRIPTION OF THE DRAWINGS

Some embodiments are illustrated in referenced figures of the drawings. It is intended that the embodiments and figures disclosed herein are to be considered illustrative rather than limiting.

Figure 1A:
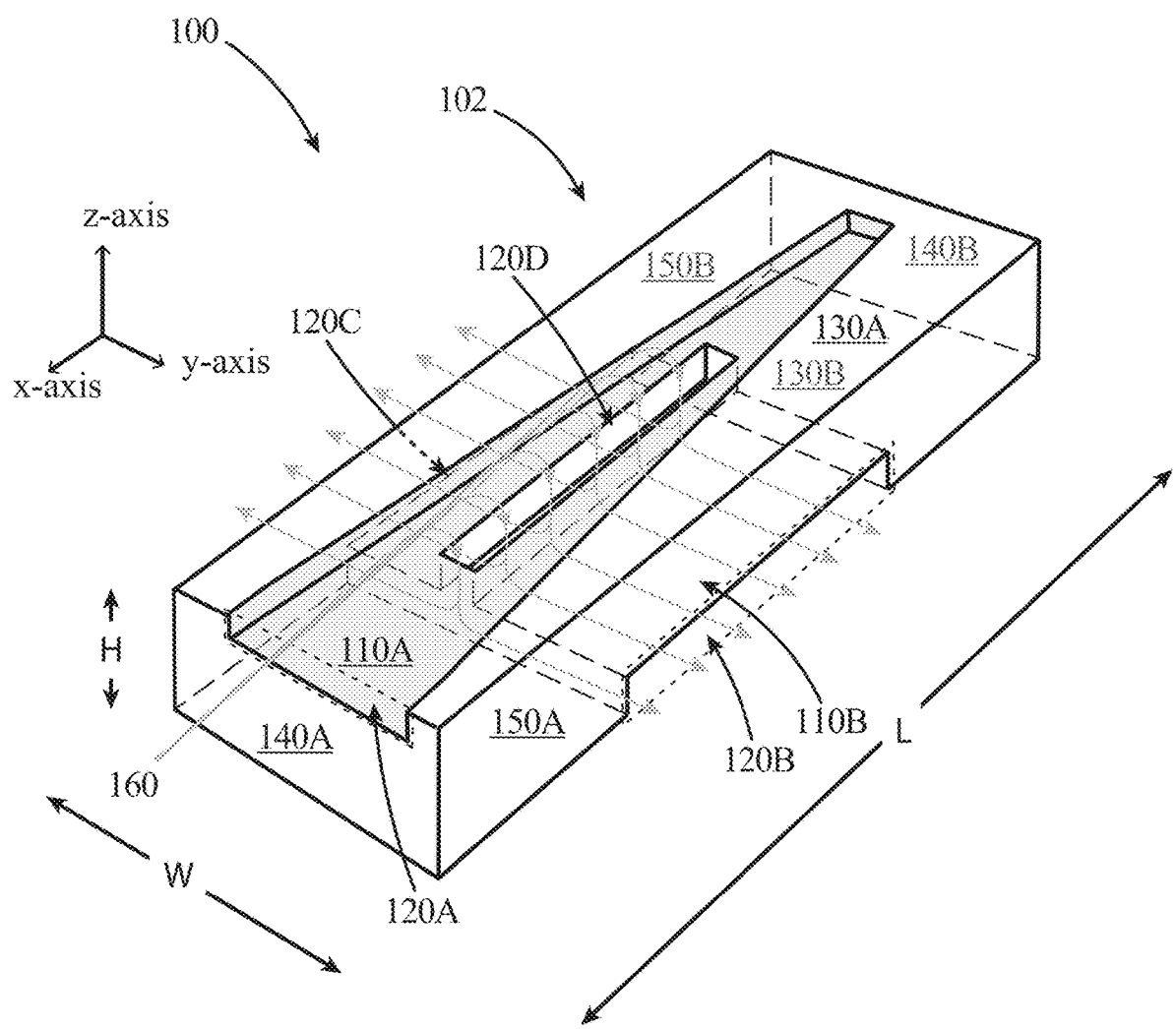
FIG. 1A illustrates a device (or manifold) for cooling an electronic component using jet impingement of a fluid directed to at least one electrical conductor connected to the electronic component, according to some embodiments of the present disclosure.

REFERENCE NUMERALS 100 device
102 block
110A first channel
110B second channel
110C third channel
110D fourth channel
110E fifth channel
120 opening
130A first surface
130B second surface
140A third surface
140B fourth surface 150A fifth surface
150B sixth surface
160 fluid
170 plate
180 electronic components
185 electrical conductor
200 system for single-sided cooling
205 cover
210 housing
215 inlet
220 outlet
225 window
230 attachment mechanism
235 inlet channel
240 outlet channel
245 drainage channel
300 multi-manifold tray
305 front of multi-manifold tray
400 system for double sided cooling with parallel fluid flow
405 housing
410 power electronics module
420 tube
500 system for double-sided cooling with fluid flow in series
505 housing

DETAILED DESCRIPTION

The embodiments described herein should not necessarily be construed as limited to addressing any of the problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to cooling automotive power electronics using, among other things, jet impingement of a dielectric fluid on a finned planar surface connected to a power electronics package. The jet impingement manifolds described herein control the fluid flow, resulting in uniform flow distribution and minimal temperature variations across the power electronics package. Using a dielectric fluid used in the other components of the automobile, such as transmission fluid or driveline fluid, as a coolant, removes the need for storing a separate coolant for the power electronics package. The jet impingement manifold designs described herein may also result in fluid directly cooling electrical interconnections. Cooling the electrical interconnections decreases auxiliary electrical temperatures and allows for high power electronics temperatures. Overall, the techniques described herein may improve the thermal performance and enable compact packing of the power electronics.

The present disclosure utilizes jet impingement, where fluid is distributed at high flow rates through slot jets, to cool power electronics. Jet impingement results in extremely high Reynolds numbers with very thin stagnation-point boundary layers. In some embodiments, the dielectric fluid is impinged on a planar surface of a heat spreader attached to the power electronics module or device. The heat spreader has fins extending towards the slot jet, and the dielectric fluid flows between the fins to contact the planar surface. Heat spreaders are typically a conductive material such as copper, aluminum, or an alloy thereof. In some embodiments, the dielectric fluid may contact the heat spreaders directly prior to being impinged on their surface.

FIG. 1A illustrates a device 100 (or manifold) for cooling an electronic component 180 (not shown in FIG. 1A, see FIG. 1C), e.g., automotive power electronics, using jet impingement of a fluid 160 directed to at least one electrical conductor 185 connected to the electronic component 180, according to some embodiments of the present disclosure. As shown in FIG. 1A, such a device 100 may include a block 102 constructed of a plastic material, a ceramic material, a metal such as stainless steel, copper, or aluminum, or a mixture or alloy thereof. In general, a fluid 160 may be directed into the block 102, and flow through a first channel 110A, after which the fluid 160 may pass through an opening 120D to exit as a jet into the second channel 110B, where the fluid 160 impinges on an electrical conductor 185 connected to the electronic component 180. In some embodiments of the present disclosure, the fluid 160 acts as a heat transfer fluid and may include a dielectric fluid, such as mineral oil, high molecular weight hydrocarbons, synthetic or natural esters, and/or silicone. In some embodiments of the present disclosure, the fluid 160 may be a fluid already in use in the greater automotive system, such as a transmission fluid, a driveline fluid, a drive train fluid, an axle lubricant, a gear or motor oil, and/or a hydraulic fluid. In some embodiments of the present disclosure, the fluid 160 may be Alpha 6, AC-100, or Automatic Transmission Fluid.

Referring again to FIG. 1A, the block 102 may be defined by six surface, two substantially parallel surfaces 130A and 130B, each positioned substantially parallel to the xy-plane (see the reference axes shown in FIG. 1A); two substantially parallel surfaces 140A and 140B, each positioned substantially parallel to the yz-plane; and two substantially parallel surfaces 150A and 150B, each positioned substantially parallel to the xz-plane. The block 102 may further be defined by a length (L) in the x-axis direction, a width (W) in the y-axis direction, and a height (H) in the z-axis direction. In some embodiments of the present disclosure, L may be between 10 and 70 mm, W may be between 10 and 15 mm, and H may be between 5 and 20 mm. In some embodiments of the present disclosure, W and H may have an aspect ratio W/H equal to or less than 1.5, L and W may have an aspect ratio L/W equal to or less than 5, and H and L may have an aspect ratio H/L equal to or less than 1. As shown in FIG. 1A, the first channel 110A may be positioned in the first surface 130 and have a depth than penetrates into the block in the z-axis direction. In some embodiments of the present disclosure, the depth that the first channel 110A penetrates the block 102 in the z-axis direction may be less than or equal to 10 mm. The first channel 110A may have a second depth that penetrates the block 102 in the x-axis direction. In some embodiments, of the present disclosure, the depth that the first channel 110A penetrates the block 102 in the x-axis direction may be less than or equal to 69 mm. As shown in FIG. 1A, the depth of the first channel 110A in the x-axis direction may have a length than is less than the length (L) of the block 102. In other words, the first channel 110A may be capped on one end, such that the fluid 160 is forced to exit the first channel 110A through the opening 120D connecting the first channel 110A to the second channel 110B. In some embodiments of the present disclosure, the first channel 110A may have a cross sectional shape in the xy-plane that is substantially triangular or conical. That is, the capped end of the first channel 110A may have a smaller width in the y-axis direction than the width in the y-axis direction of the opening 120A.

In some embodiments of the present disclosure, the fluid 160 may enter the first channel 110A through the first opening 120A, such that the first channel 110A directs the fluid 160 through the first channel 110A to the second opening 120D. In this example, the second opening 120D has a cross-sectional shape in the xy-plane that is substantially rectangular in shape. However, the opening 120D may have other suitable cross-sectional shapes such as square, circle, elliptical, rectangular, or triangular. For the example shown in FIG. 1A, the fluid 160 will be distributed across the entire length of the rectangularly-shaped opening 120D. The substantially triangular cross-sectional shape in the xy-plane of the first channel 110 may maintain a substantially constant fluid velocity in the x-axis direction, thereby maintaining a substantially constant fluid velocity of the fluid jet exiting the opening 120D and impinging on the electronic component 180.

Referring again to FIG. 1A, after exiting the opening 120D and impinging on the electrical conductor 185 (not shown in FIG. 1A, see FIG. 1C), the deflected fluid 160 may split and flow through the second channel 110B to exit one or both openings 120B and 120C. In some embodiments of the present disclosure, like the first channel 110A, the second channel 110B may penetrate into the block 102 in the z-axis direction to a depth between 1 and 5 mm. Unlike the first channel 110A, the second channel 110B may pass directly through the entire width, W, of the block 102 in the y-axis direction, resulting in the formation of two openings 120B and 120C. As shown in the FIG. 1A, each of the openings 120B and 120C may have cross-sectional shapes that are rectangular or square in shape, although other shapes fall within the scope of the present disclosure.

Referring again to FIG. 1A, in summary, in some embodiments of the present disclosure, a fluid 160 (e.g., a heat transfer fluid or coolant) may enter a block 102 through an opening 120A leading to a first channel 110 such a that the fluid 160 is directed through a first channel 110A to exit the first channel 110A through an opening 120D, which directs the fluid in the form of a jet to enter a second channel 120B to impinge against an electronic component 180. The fluid 160 may pass through the second channel 110A, with the now-cooled fluid 160 exiting the block 102 through openings 120B and 120C.

Figure 1B:
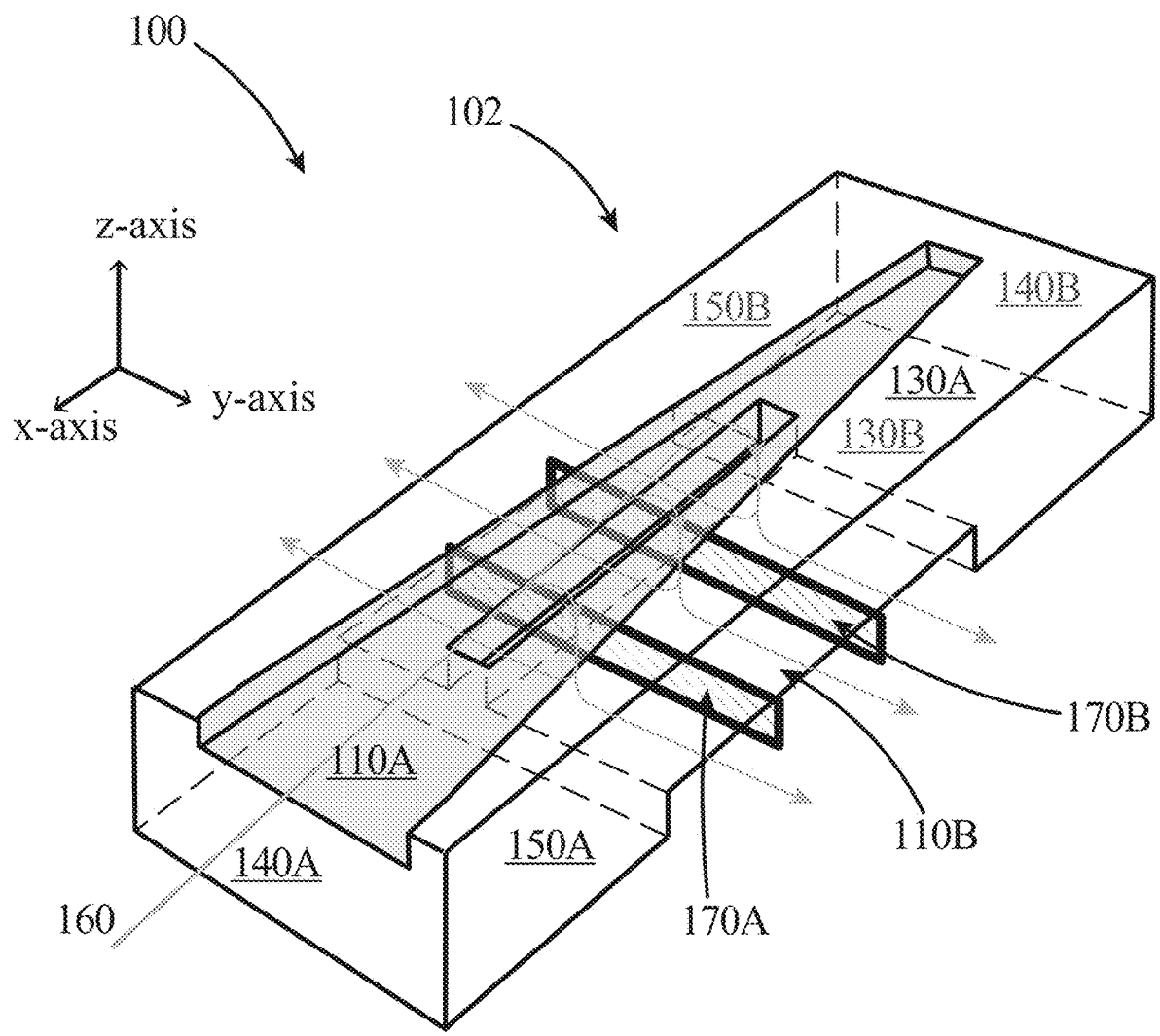
FIG. 1B illustrates other features of a device for cooling electronic components 180, according to some embodiments of the present disclosure.

FIG. 1B illustrates other features of a device 100 for cooling electronic components 180, according to some embodiments of the present disclosure, specifically plates 170A and 170B, which may behave as baffles to direct flow of the fluid 160 to drain off the surface of the electronic components 180 after the fluid 160 impinges on the surface of the electronic components 180. The plates 170A and 170B may also behave as fins or heat spreaders and cool the electronic components 180. Although FIG. 1B illustrates only two plates 170A and 170B, any suitable number of plates may be used, for example, between 1 and 50 plates. However, in some embodiments, more than 50 plates may be used. As shown in FIG. 1B, a plate 170A and/or 170B may be positioned substantially vertically related to the z-axis and parallel to the zy-plane. Among other things, this alignment may direct the flow of the fluid 160 to the openings 120B and 120C. The plate 170 A and/or 170B may be substantially rectangular in shape. In some embodiments, the plates 170 may be comprised of an electrically conductive material, such as copper or aluminum. In other embodiments, the plates 170 may be comprised of an electrically insulating material such as a plastic or ceramic.

Figure 1C:
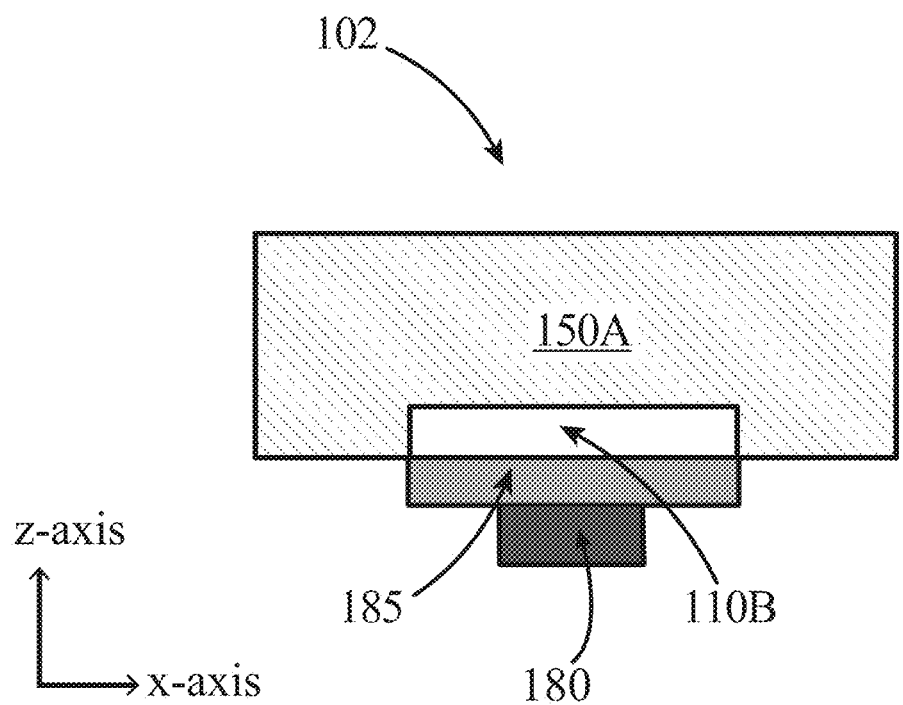
FIG. 1C illustrates an exemplary orientation of an electronic component relative to a first side of a block and a second channel, according to some embodiments of the present disclosure.

FIG. 1C illustrates an exemplary orientation of an electronic component 180 relative to a first side 150A of a block 102 and a second channel 110B, according to some embodiments of the present disclosure. Examples of the electronic components 180 that may be cooled according to the devices, systems, and methods described herein include conventional (top side) wire-bonded devices or double-sided solderable devices with heat spreaders on both sides. For example, in some embodiments of the present disclosure, the electronic components may be power electronics such as metal oxide semiconductor field-effect transistors (MOSFET), insulated-gate bipolar transistors (IGBT), direct bonded copper (DBC) substrates, high frequency switch mode power supplies (SMPS), or other power inverters or modules.

Figure 2A:
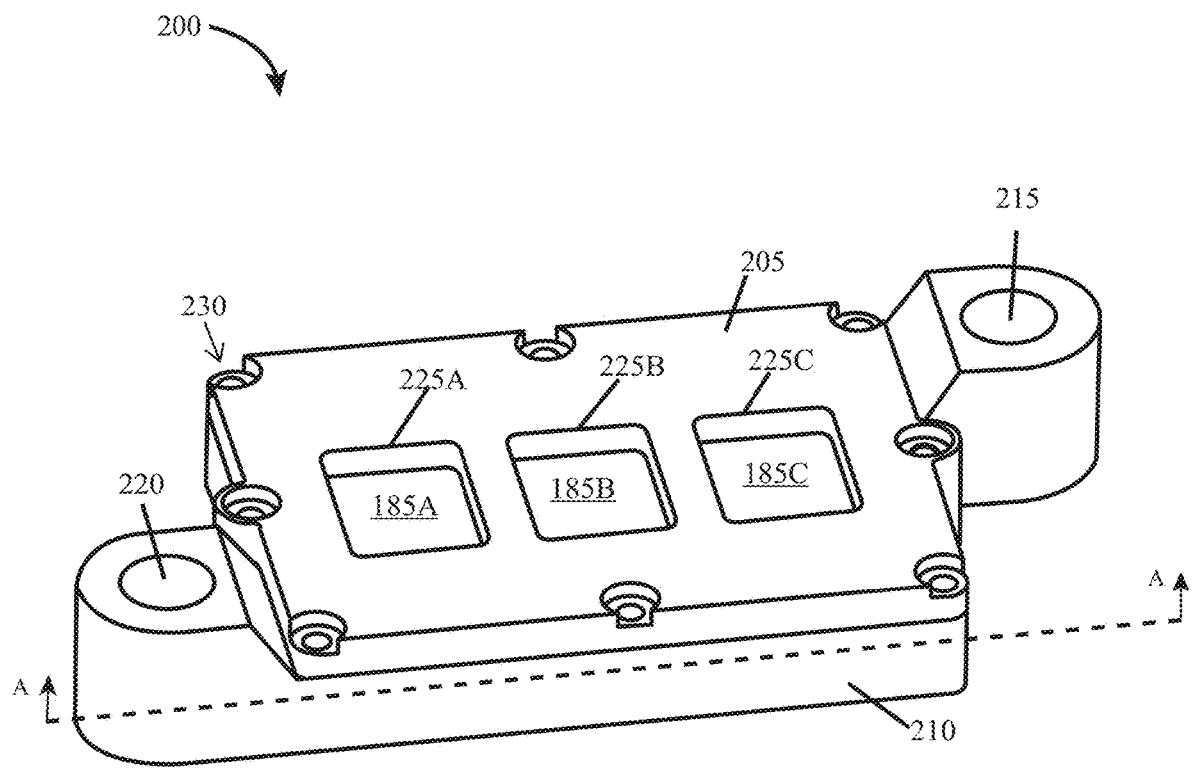
FIG. 2A illustrates an orthogonal view and FIG. 2B illustrates a cross section view of a system for single-sided cooling of power electronics using six manifolds according to some embodiments of the present disclosure.

FIG. 2A illustrates an orthogonal view of a system 200 for single-sided cooling of electronics components 180 using six devices 100 according to some embodiments of the present disclosure. The system 200 for single-sided cooling utilizes multiple devices 100 to impinge the fluid 160 on multiple electrical conductors 185 simultaneously. The system 200 for single-sided cooling of power electronics includes a cover 205 and a housing 210. An inlet 215 and an outlet 220 are on opposite sides of the housing 210. The cover 205 and housing 210 are connected using some type of attachment mechanism 230. The attachment mechanism 230 may be screws, nails, bolts, gaskets, or other similar means. The cover 205 includes at least one window (shown as three windows, 225A, 225B, and 225C) containing at least one electrical conductor 185 (shown as three electrical conductors 185A, 185B, and 185C).

Figure 2B:
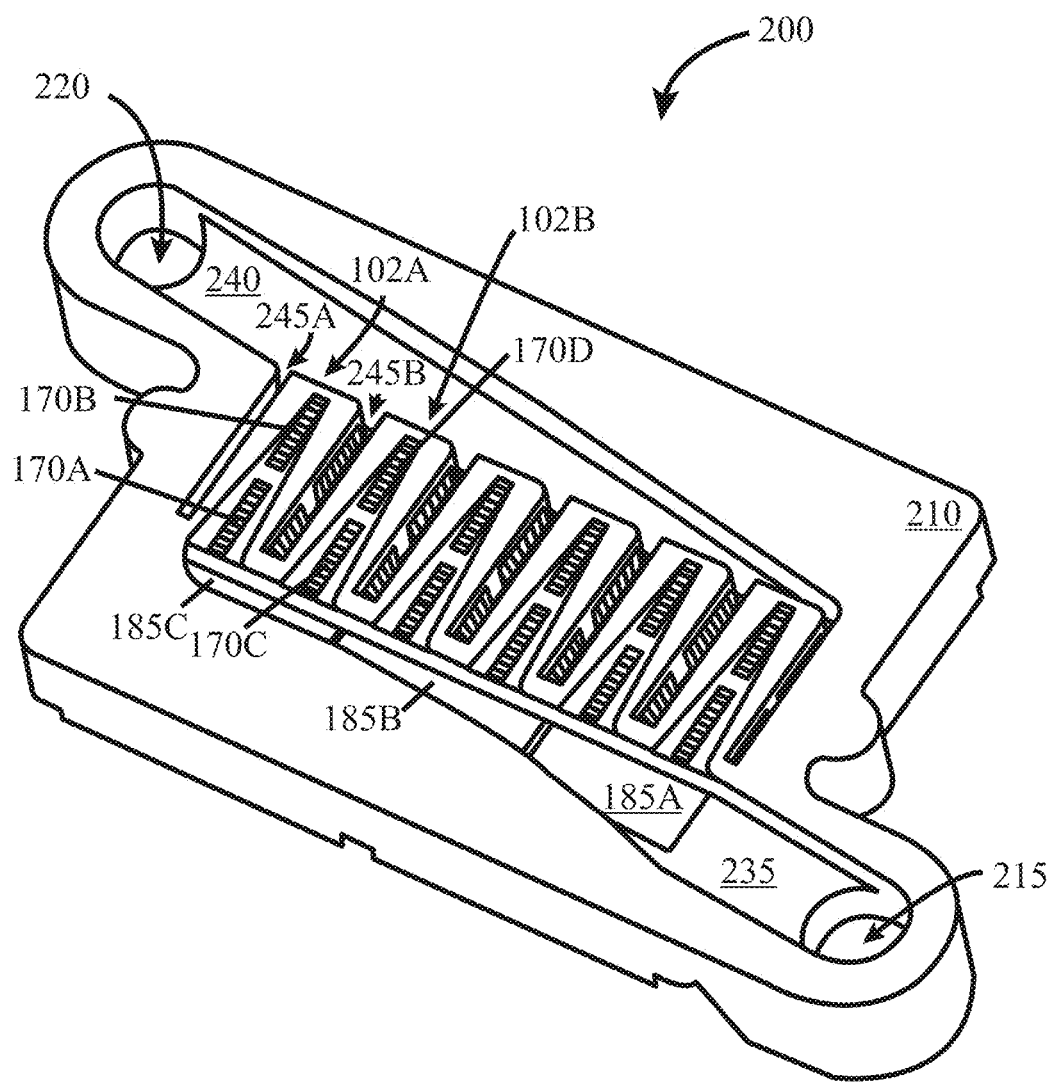

FIG. 2B illustrates a cross-section of the interior of the system 200 for single-sided cooling cut along line A according to some embodiments of the present disclosure. The exemplary housing 210 shown in FIG. 2B contains six blocks 102 (labeled as 102A and 102B), however a system 200 for single-sided cooling could contain any number of blocks 102. On either side of each block 102 there is a drainage channel 245 (shown as 245A and 245B). The inlet 215 is connected to an inlet channel 235 and the outlet 220 is connected to an outlet channel 240. The inlet channel 235 and/or the outlet channel 240 may be sloped or angled to increase the flow rate of the fluid 160 into and/or out of the housing 210. Each block 102 is in contact with a plurality of plates 170A-K. Electronic components 180A, 180B, and 180C extend underneath the blocks 102A and 102B. The system 200 for single-sided cooling is configured to have fluid 160 (not shown) enter through the inlet 215, flow through the inlet channel 235, into the blocks 102, impinge on to the electrical conductors 185A, 185B, and 185C, as shown in FIGS. 1A-C, then drain via the drainage channels 245A-G to the outlet channel 240 then the outlet 220.

Figure 3:
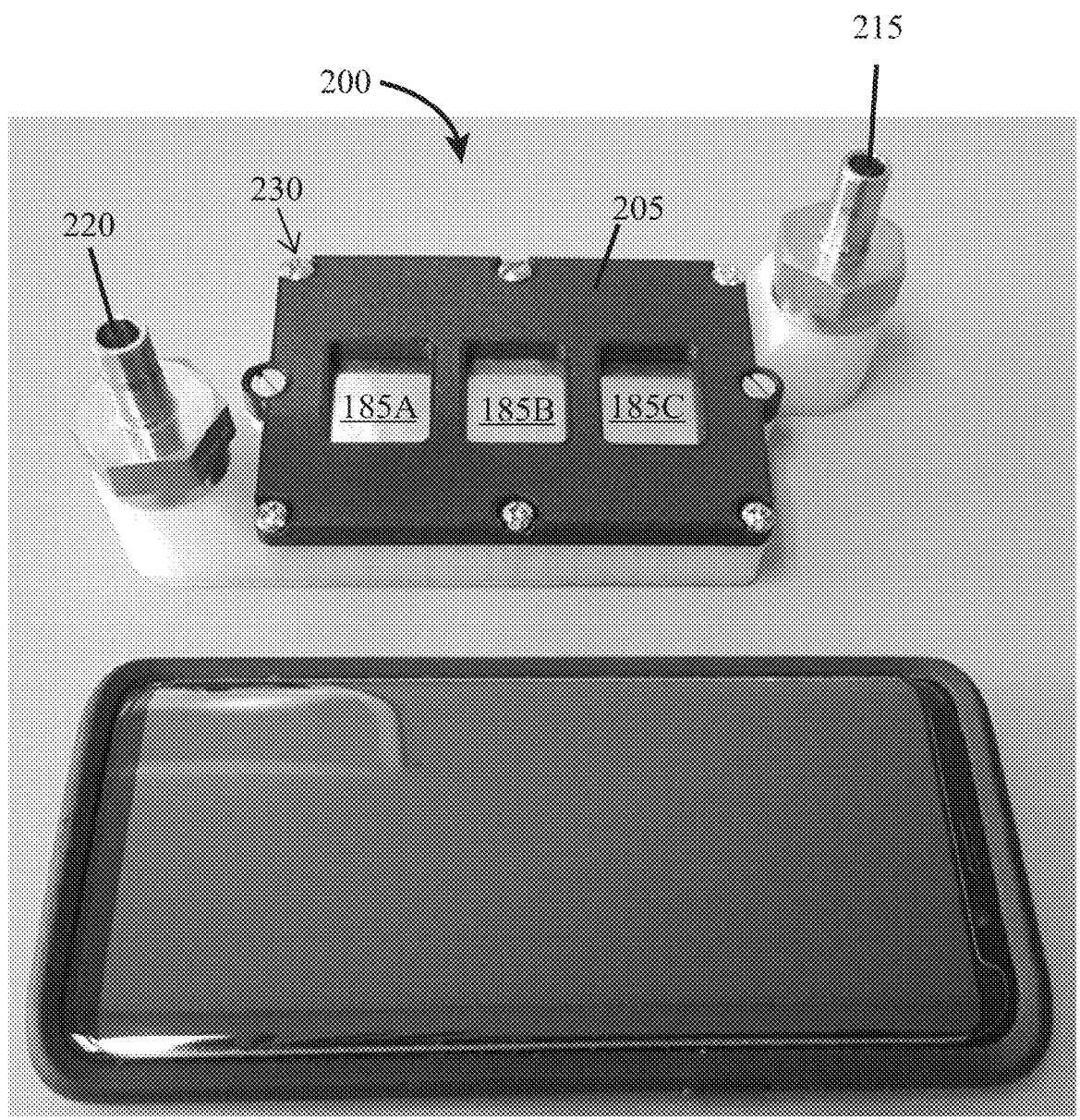
FIG. 3 is a photograph of a 3-D printed prototype of a system for single-sided cooling of power electronics, in accordance with one or more aspects of the present disclosure; a typical smartphone is also shown, for size reference.

FIG. 3 is a photograph of a 3-D printed prototype of a system 200 for single-sided cooling, in accordance with one or more aspects of the present disclosure; a typical smartphone is also shown, for size reference. The system 200 for single-sided cooling as shown has a width in the x-axis direction of 70 mm, a length in the y-axis direction of 90 mm (for the main part of the housing 210 between the inlet 215 and the outlet 220), and a height in the z-axis direction of 18 mm (for the main part of the housing 210 between the inlet 215 and the outlet 220). For reference, the smartphone shown has a width in the x-axis direction of 76 mm, a length in the y-axis direction of 151 mm, and a height in the z-axis direction of 8 mm. The system 200 for single-sided cooling delivers a fluid 160 to multiple electronic components 180 for cooling to achieve high performance and low pumping power in a compact package using six blocks 102 (not shown in FIG. 3).

Figure 4:
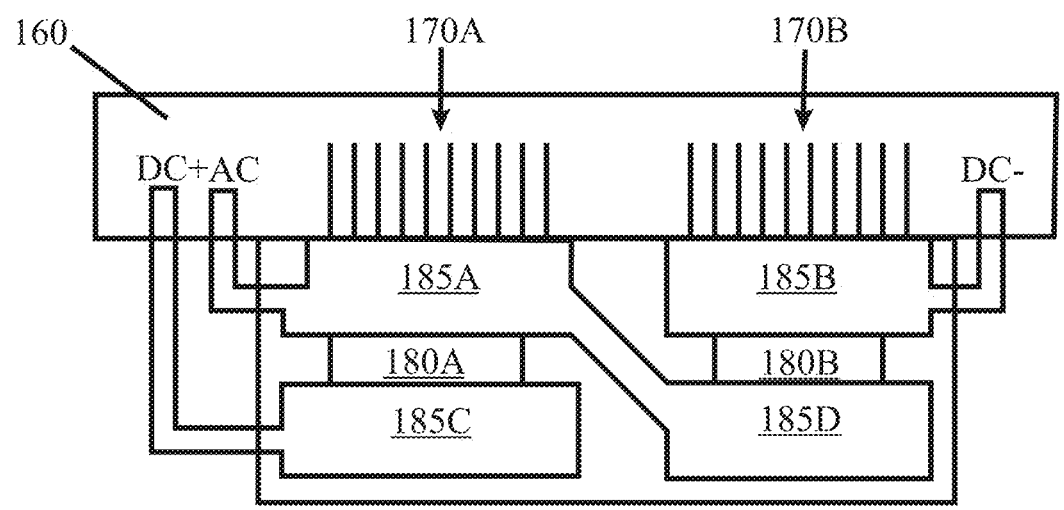
FIG. 4 illustrates electrical aspects of the system for single-sided cooling of power electronics, in accordance with one or more aspects of the present disclosure.

FIG. 4 illustrates electrical aspects of a system 200 for single-sided cooling, in accordance with one or more aspects of the present disclosure. The electronic components 180 may be electric devices that have a source side (or heat generating side). The cooling technique demonstrated by the device for single-sided cooling 200 allows for source side cooling of the electronics components 180A-F. The electrical conductors 185A-D may be composed of copper, aluminum, or another conductive material or alloy thereof. The electrical conductors 185A-D may act as heat spreaders to cool the electronic components 180A and 180B, which may be heat-generating electrical devices, such as MOSFETs, IGBTs, DBC substrates, SMPS, or other power inverters or power modules. A plurality of plates 170A and 170B may extend substantially perpendicular from the electrical conductors 185A and 185B. The plurality of plates 170A and 170B may be made of the same conductive material as the electrical conductors 185A-D, such as copper, aluminum, or an alloy thereof, or may be a different material, such as an insulator like ceramic. The plurality of plates 170A and 170B and the direct current (DC) positive and negative terminal and alternating current (AC) terminal may be submerged or doused by a fluid 160. FIG. 4 demonstrates how the DC and AC terminals may be cooled by the fluid 160 directly, increasing the efficiency of the cooling techniques described herein. In some embodiments, the fluid 160 flows across the electrical conductors 185A-C for cooling.

In some embodiments, the DC minus terminal can be routed on the same side as the DC plus the terminal to reduce inductance.

Figure 5A:
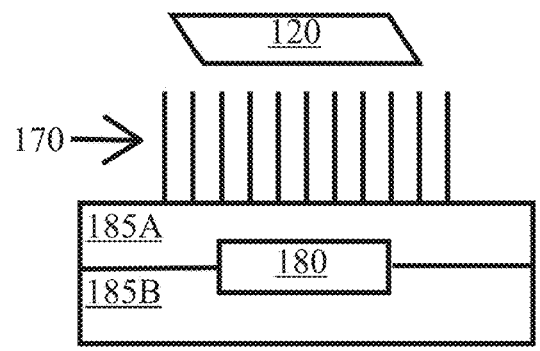
FIG. 5A illustrates a front view.
Figure 5B:
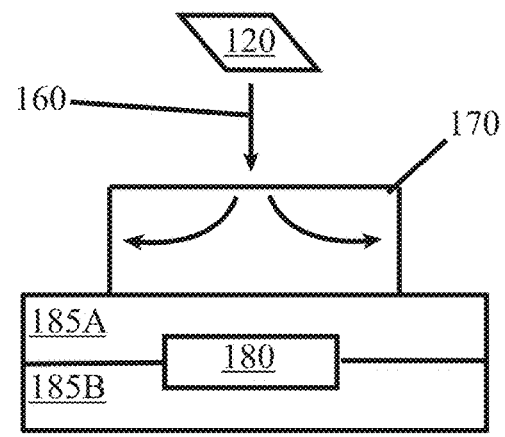
FIG. 5B illustrates a side view.
Figure 5C:
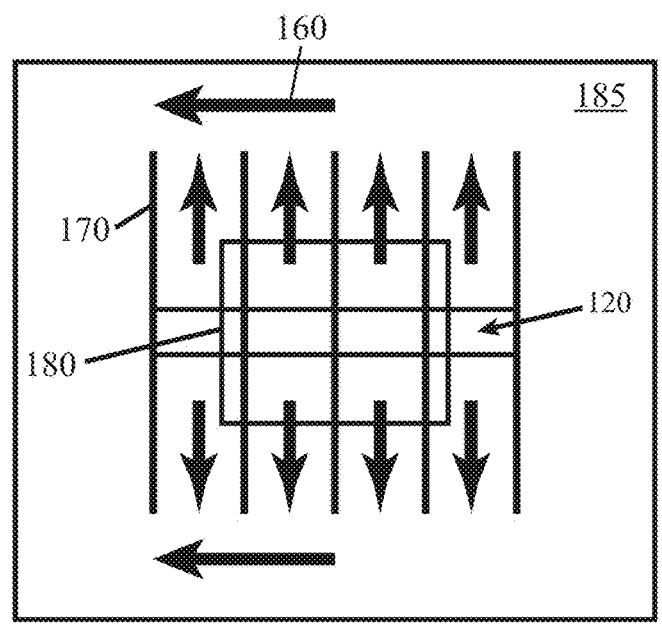
FIG. 5C illustrates a top view of a manifold for cooling power electronics, in accordance with one or more aspects of the present disclosure.

FIG. 5A illustrates a front view, FIG. 5B illustrates a side view, and FIG. 5C illustrates a top view of portions of a device 100 for cooling electronic components, in accordance with one or more aspects of the present disclosure. FIGS. 5A-C demonstrate how the present disclosure utilizes jet impingement with a dielectric fluid for dielectric cooling of electronic components 180. In a device 100, the electronic components 180 are positioned between a pair of electrical conductors 185A and 185B. Some electronic components 180 may only have a single electrical conductor 185 (not shown in FIGS. 5A-C). Extending substantially perpendicularly from the electrical conductor 185A is a plurality of plates 170, which may be substantially rectangular in shape. The plates 170 may be substantially planar. A fluid 160 is pumped through the opening 120 (shown as opening 120D in FIG. 1A) of the device 100 then distributed through the plates 170. The opening 120 is positioned such that the fluid 160 exiting the opening 120 contacts the plate 170 as it is impinged on the electrical conductor 185 and drains to either side of the plates 170. The opening 120 may be positioned such that the fluid 160 is directed to the midpoint of the width of the plates 170. That is, that an approximately equivalent volume of the fluid 160 will flow to either side of the plate 170. The electronic components 180 may be substantially centered under the plates 170 such that the midpoint of the width of the electronic components 180 is aligned with the midpoint of the width of the plates 170. As shown in FIG. 5C, after flowing through the plates 170 the fluid 160 drains to either side of the plates 170. The fluid 160 flow process shown in FIGS. 5A-C results in relatively uniform cooling throughout the electronic components 180.

Figure 6:
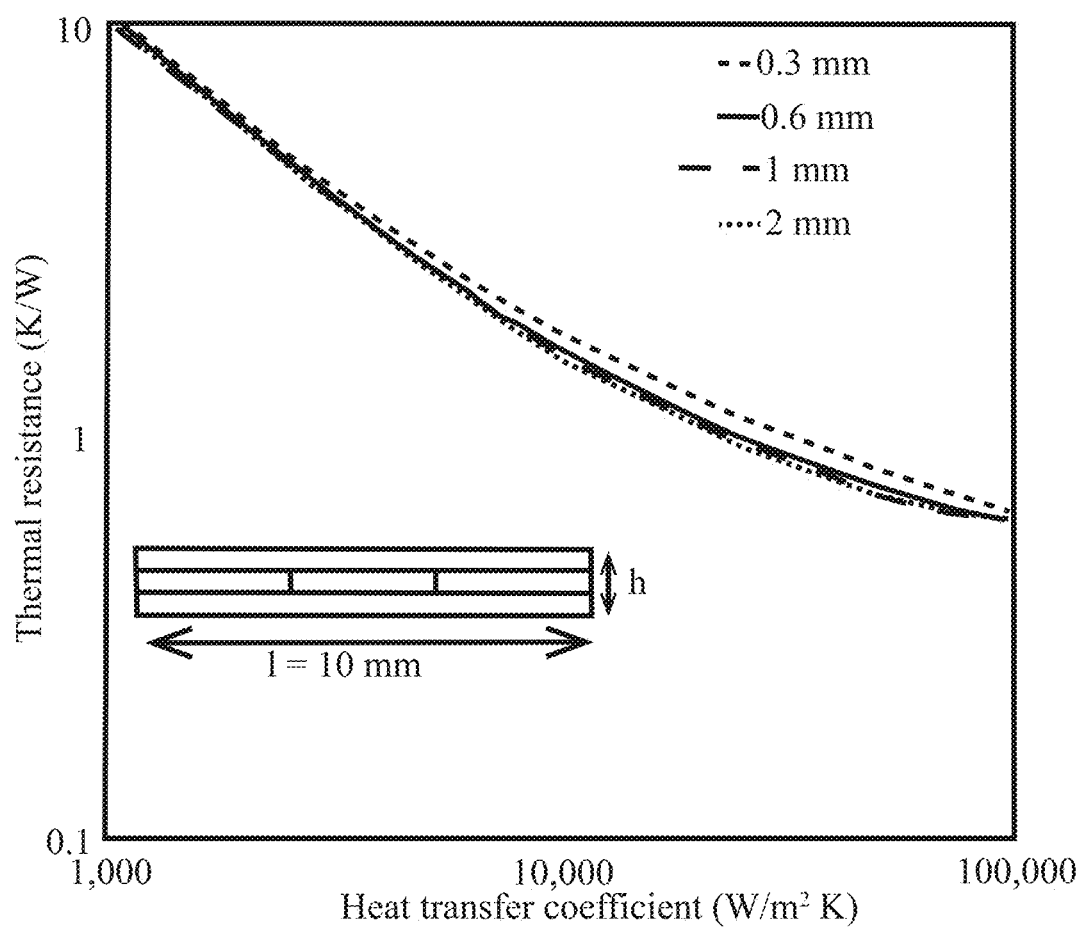
FIG. 6 illustrates the relationship between the thickness of an electrical conductor used in connection with a system for single-sided cooling power electronics accordance with one or more aspects of the present disclosure and thermal resistance.

FIG. 6 illustrates the relationship between the thickness (h) of an electrical conductor 185 used in connection with a system 200 for single-sided cooling accordance with one or more aspects of the present disclosure and thermal resistance. Electrical conductor 185 thicknesses of 0.3 mm, 0.6 mm, 1 mm, and 2 mm were tested while the length of the heat spreader was held constant at 10 mm. As illustrated by FIG. 6, increasing electrical conductor 185 thickness provides lower thermal resistance. The prototype shown in FIG. 3 had an electrical conductor 185 thickness of approximately 2 mm (not shown in FIG. 3). Resistance heaters were used in place of electronic components 180 for the tests shown in FIG. 6.

Figure 7:
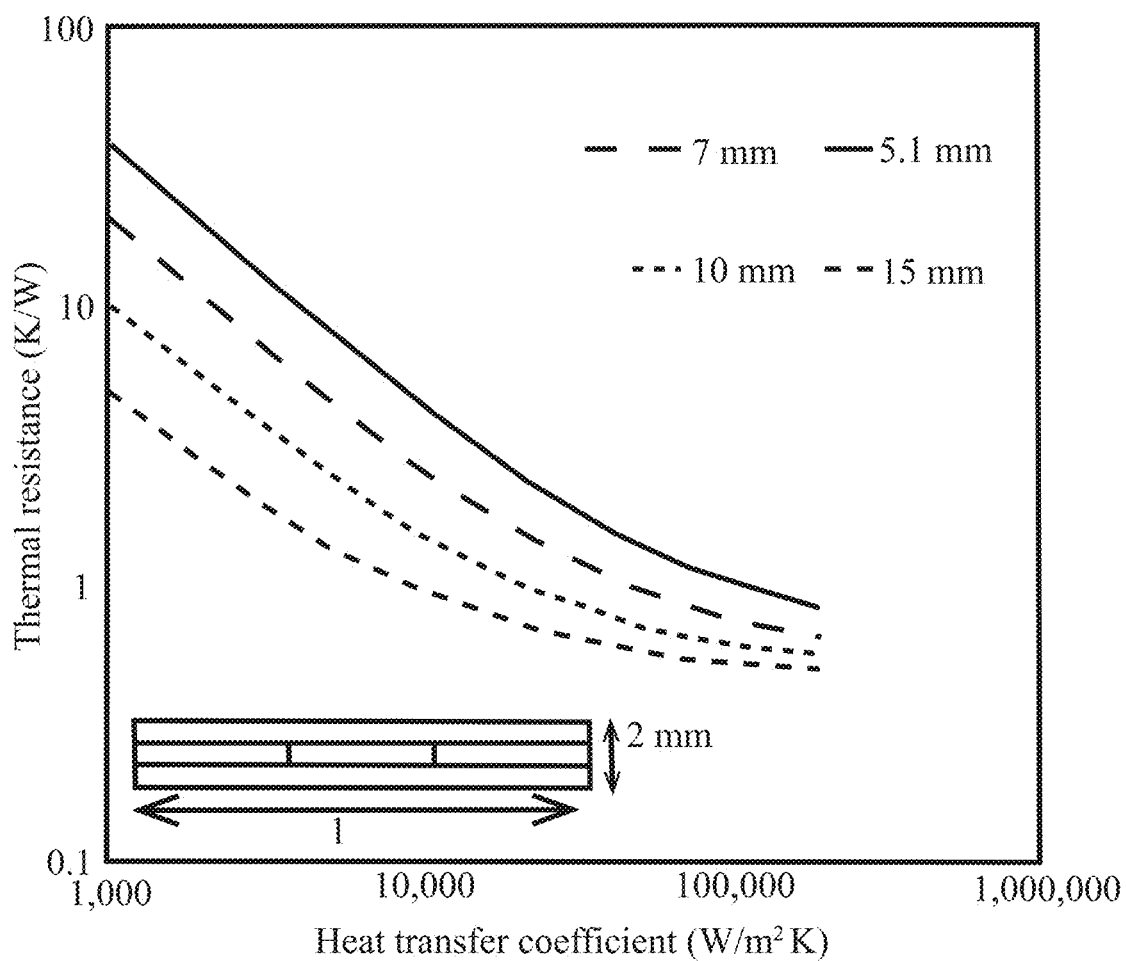
FIG. 7 is a graph demonstrating the relationship between the size of an electrical conductor used in connection with a system for single-sided cooling of power electronics in accordance with one or more aspects of the present disclosure and thermal resistance.

FIG. 7 is a graph demonstrating the relationship between the length (l) of electrical conductor 185 used in connection with a system 200 for single-sided cooling in accordance with one or more aspects of the present disclosure and thermal resistance. Electrical conductor 185 lengths of 5.1 mm, 7 mm, 10 mm, and 15 mm were tested. As illustrated by FIG. 7, increasing the electrical conductor 185 length increases the heat transfer capabilities of the system 200 for single-sided cooling but also increases size of the system 200 for single-sided cooling. The prototype shown in FIG. 3 had an electrical conductor 185 length of approximately 10 mm (not shown in FIG. 3).

Figure 8:
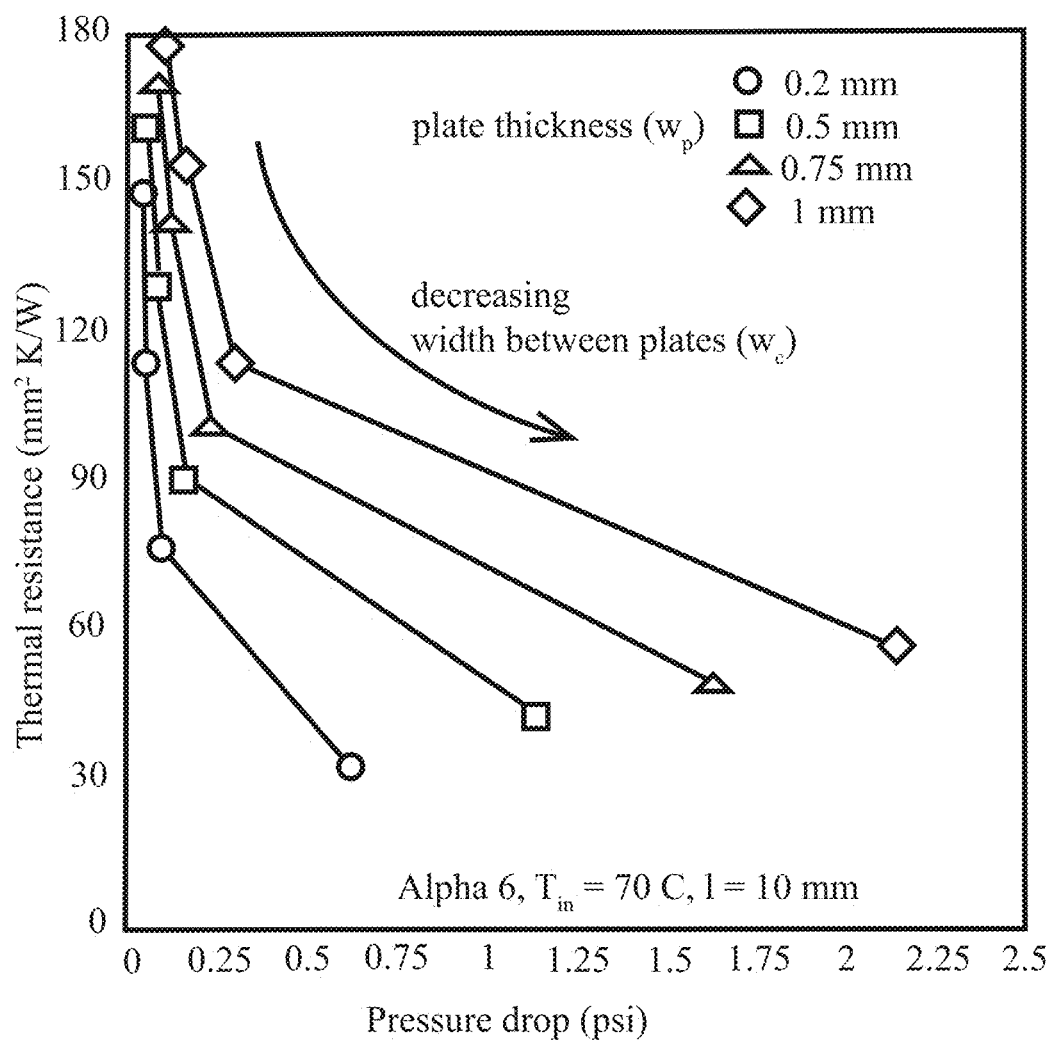
FIG. 8 is a graph demonstrating the relationship between the thickness of plates used in connection with a system for single-sided cooling of power electronics in accordance with one or more aspects of the present disclosure and thermal resistance.

FIG. 8 is a graph demonstrating the relationship between the thickness of plates 170 ($w_p$) used in connection with a system 200 for single-sided cooling in accordance with one or more aspects of the present disclosure and thermal resistance. Plate 170 thicknesses of 0.2 mm, 0.5 mm, 0.75 mm, and 1.0 mm were tested. As the plate 170 thickness ($w_p$) increases, the distance between the plates 170 ($w_c$) decreases. As illustrated by FIG. 8, thinner plates 170 provide lower thermal resistance and lower pressure drop. The prototype shown in FIG. 3 had a plate 170 thickness of 0.2 mm (not shown in FIG. 3).

Figure 9:
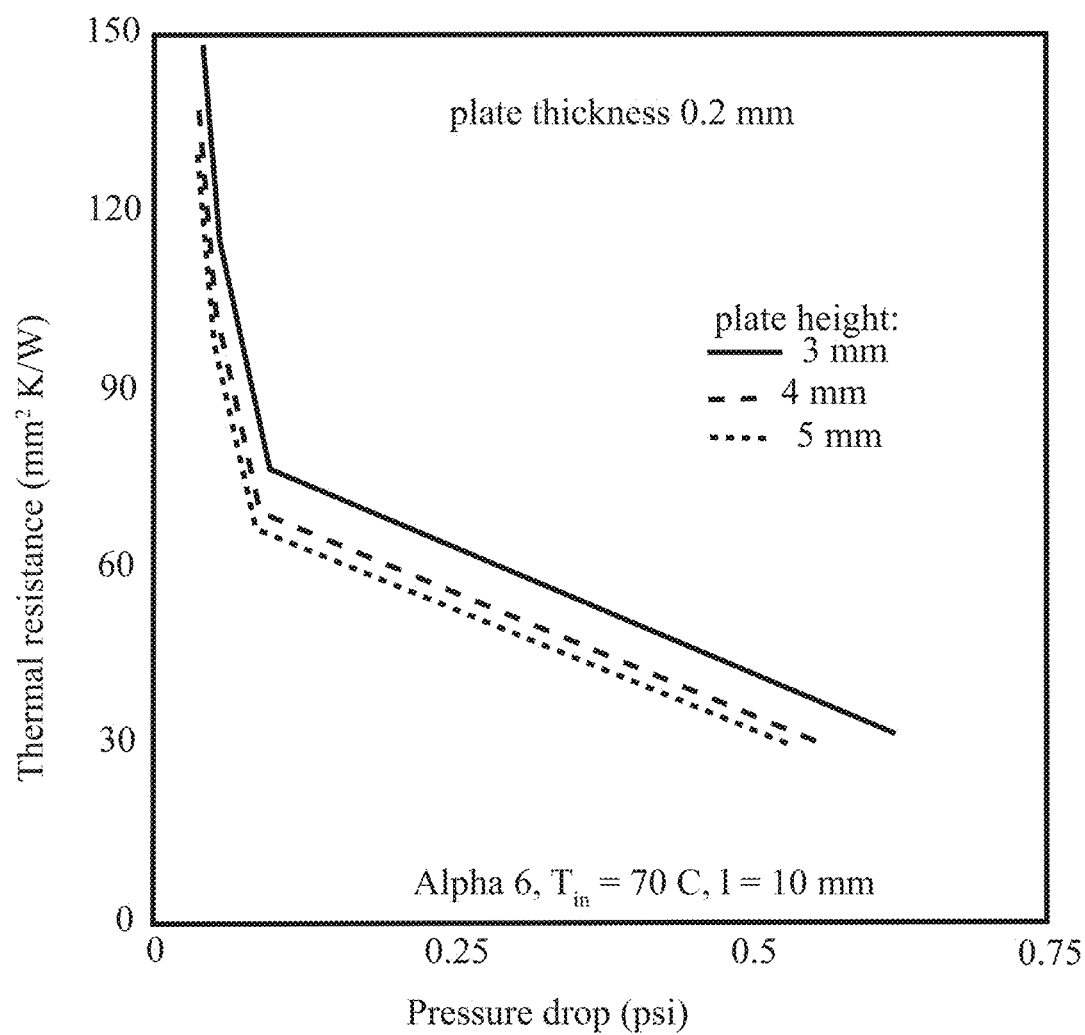
FIG. 9 is a graph demonstrating the relationship between the height of plates used in connection with a system for single-sided cooling of power electronics in accordance with one or more aspects of the present disclosure and thermal resistance.

FIG. 9 is a graph demonstrating the relationship between the height of plates 170 used in connection with a system 200 for single-sided cooling in accordance with one or more aspects of the present disclosure and thermal resistance. The plate 170 thickness was held constant at 0.2 mm while plate 170 heights of 3 mm, 4 mm, and 5 mm were tested. As shown in FIG. 9, the increase in performance between plates 170 with a height of 4 mm and 5 mm was minor. The prototype shown in FIG. 3 had plates 170 with a height of 4 mm (not shown in FIG. 3).

Figure 10:
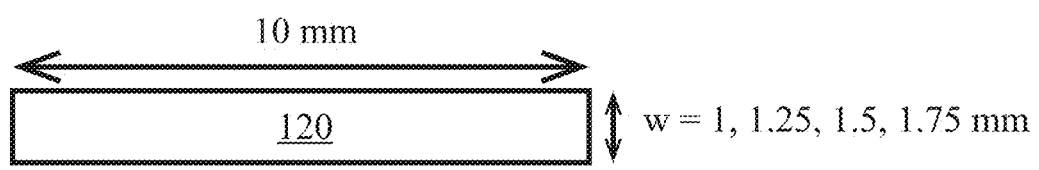
FIG. 10 is a conceptual diagram illustrating a cross section of a slot/jet opening as used in a system for cooling electronic components, in accordance with one or more aspects of the present disclosure with the slot showing dimensions to be varied.

Table 1 shows the effect of slot jet width on the thermal resistance of the prototype design shown in FIG. 3. An image of an opening 120 acting as a slot jet showing the dimensions varied is shown in FIG. 10. As shown in FIG. 10, the width of the opening 120 (indicated by w) is varied in Table 1.

TABLE 1

Varying slot jet widths and their effects on thermal resistance.

|  | w = 1 mm | w = 1.25 mm | w = 1.5 mm | w = 1.75 mm |
|---|---|---|---|---|
| Jet velocity (m/s) | 0.5 | 0.425 | 0.37 | 0.325 |
| R"th (plate base) (mm$^2$-K/W) | 59.24051529 | 58.46686262 | 57.96272568 | 57.70445604 |
| HTC (plate base) (W/m$^2$-K) | 16880.34 | 17103.71 | 17252.47 | 17329.68 |
| Pumping power (W) | 1.30E−04 | 1.25E−04 | 1.22E−04 | 1.17E−04 |
| Total flow rate (12 openings) (LPM) | 3.6 | 3.825 | 3.996 | 4.095 |

As shown in Table 1, an opening 120 width of 1.75 mm increases the heat transfer coefficient (i.e., reduces thermal resistance), lowers pumping power, reduces impingement velocity, and increases total flow rate (which reduces outlet fluid temperature). Note that in Table 1 the total flow rate is the flow rate of fluid through 12 openings 120 in the system 200 for single-sided cooling.

Figure 11:
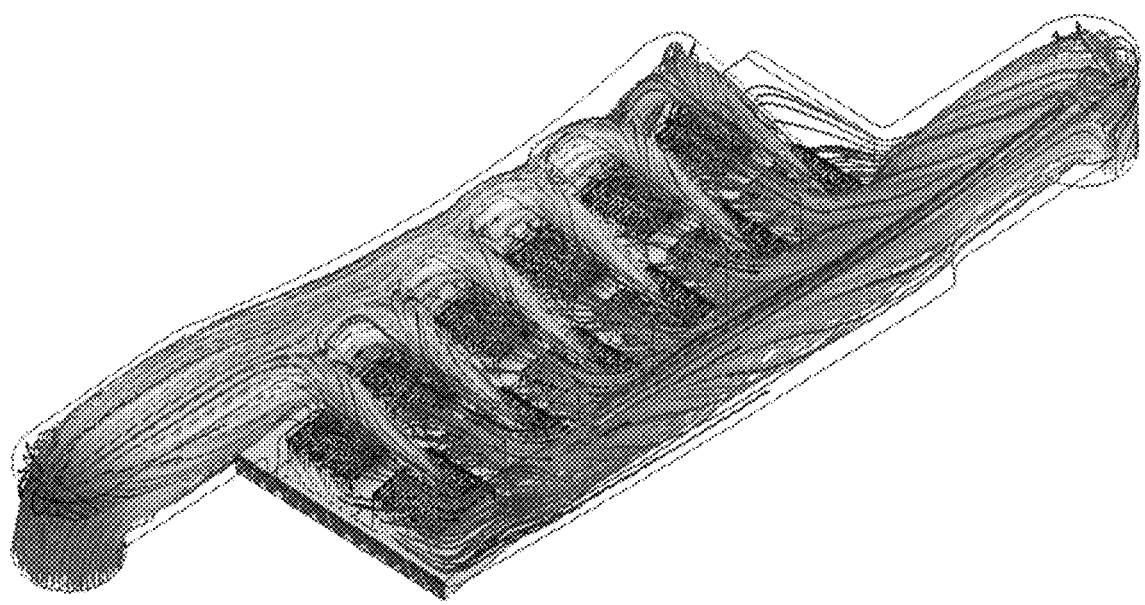
FIG. 11 illustrates the flow of fluid through a system for single-sided cooling of power electronics, in accordance with one or more aspects of the present disclosure using computational fluid dynamics.
Figure 14:
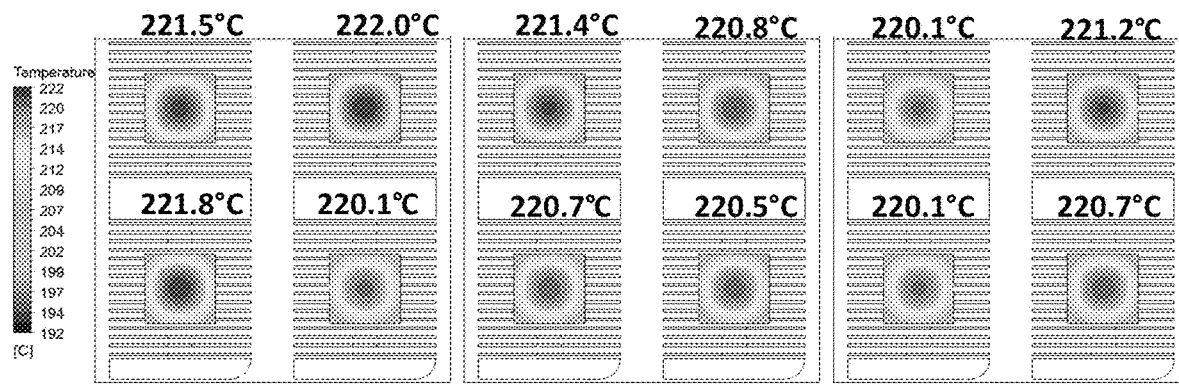
FIG. 14 illustrates modeled temperatures for 12 electronic components when using a system for single-sided cooling of power electronics in accordance with one or more aspects of the present disclosure.

FIG. 11 illustrates the flow of a fluid 160 through a system 200 for single-sided cooling, in accordance with one or more aspects of the present disclosure using computational fluid dynamics (CFD). The gray lines indicate the path of fluid 160 through the system 200 for single-sided cooling. The fluid 160 enters the system 200 for single-sided cooling through the inlet 215, enters each device 100 through an opening 120A of the first channel 110A then flows through the opening 120D, drains to the drainage channel 245 then exits the device 100 through the outlet 220. CFD analysis indicated that the methods and systems described herein resulted in relatively uniform fluid flow through each opening 120D, resulting in relatively uniform cooling of the electronic components 180 (as shown in FIG. 14).

Figure 12:
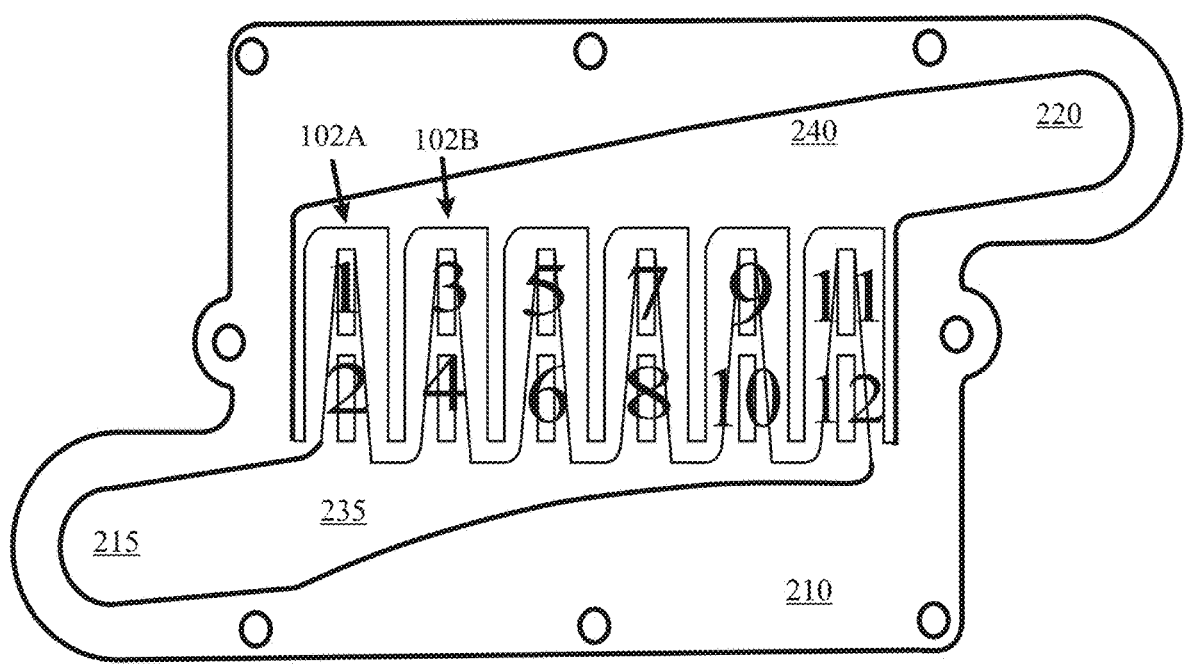
FIG. 12 illustrates a top view of a system for single-sided cooling of power electronics, in accordance with one or more aspects of the present disclosure.

FIG. 12 illustrates a top view of a system 200 for single-sided cooling, in accordance with one or more aspects of the present disclosure. FIG. 12 illustrates the numbering scheme for openings 120D in a system 200 for single-sided cooling. In some embodiments, the number of openings 120D in a system 00 for single-sided cooling may be equivalent to the number of electronic components 180 to be cooled. While the exemplary system 200 for single-sided cooling shown in FIG. 12 has 12 openings 120D, the system 200 for single-sided cooling may have more or less openings 120D in other embodiments. The inlet channel 235 is sloped to create a contoured flow path. The first channel 110A creates tapered flow paths (at the slot path plenum, which is where fluid 160 moves to opening 120D from the first channel 110A), which are also shown by the CFD diagram in FIG. 11. The system 200 for single-sided cooling shown in FIG. 12 is designed with internal geometry to evenly distribute fluid 160 flow to the 12 blocks 102 (each acting as a slot jet) of this system 200 for single-sided cooling. In some embodiments, the present disclosure results in approximately ±5% of flow variation among the 12 openings 120D.

Figure 13:
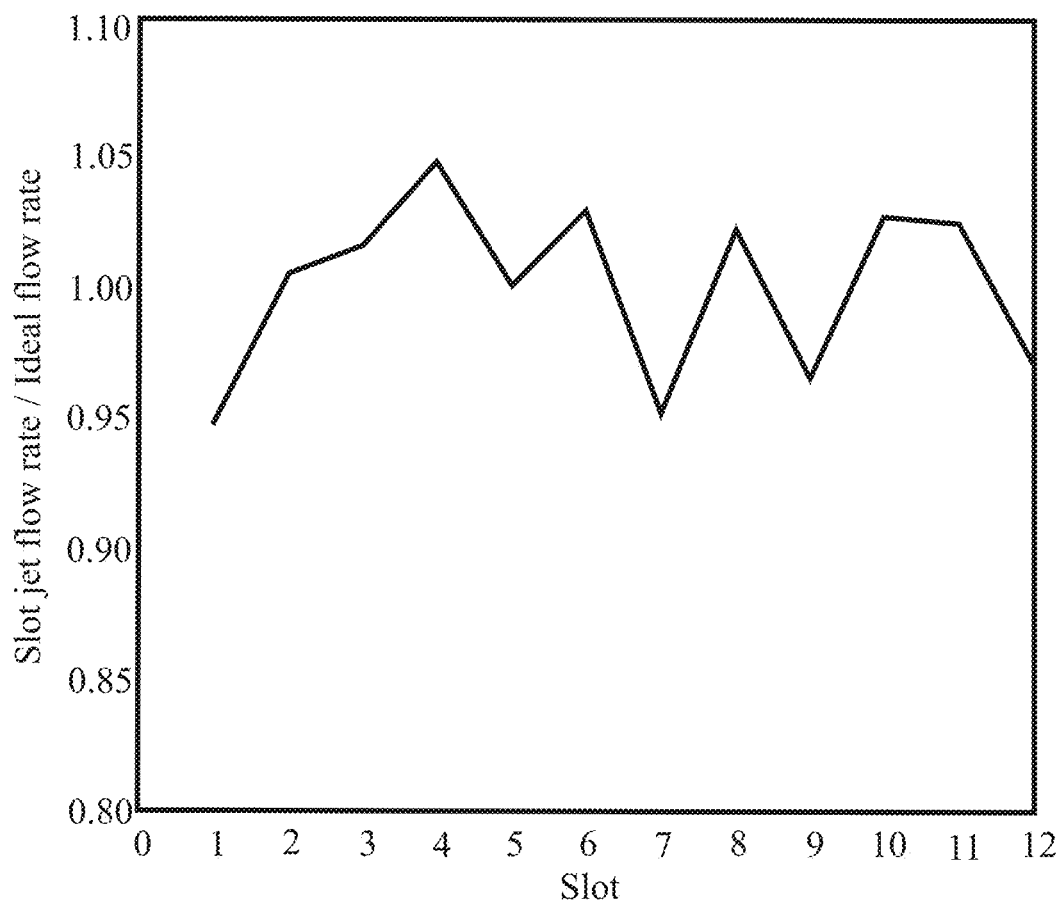
FIG. 13 illustrates a graph showing a comparison of modeled actual slot jet flow rate to ideal flow rate for each slot of the system shown in FIG. 3 with slots numbered according to FIG. 12, in accordance with one or more aspects of the present disclosure.

FIG. 13 illustrates a graph showing a comparison of modeled actual slot jet flow rate to ideal flow rate for each opening 120D of the system 200 for single-sided cooling with openings 120D numbered according to FIG. 12, in accordance with one or more aspects of the present disclosure. The ideal flow rate is based on the total flow rate indicated in Table 1 for an opening 120D width of 1.75 mm, which is approximately 4.1 LPM. Based on this calculated ideal flow rate, the slot jet flow rate of each opening 120D should be approximately 0.34 LPM per jet (which would be a value of 1.00 on the graph). As indicated by the graph of FIG. 13, the actual flow rate in each opening 120D varies between slightly more and slightly less than the ideal flow rate. FIG. 13 shows how the methods, systems, and devices described herein result in relatively uniform flow between a plurality of openings 120D and rapid fluid flow rates.

FIG. 13 shows the computed temperatures for the 12 openings 120D of the system 200 for single-sided cooling of FIG. 12. For the system 200 for single-sided cooling, the heat flux is 718 W, maximum temperature ($T_{max}$) is 222° C. and the temperature variation is 1.9° C. The calculations indicate that the system 200 for single-sided cooling of FIG. 12 may dissipate a total of 2,150 W from electronic components 180 and enable very high heat flux 718 W/cm$^2$ with 222° C. maximum junction temperatures. 2,150 W is approximately the estimated heat load for a 100 kW wide-bandgap inverter, an exemplary electronic component 180. The total volume of the system 200 for single-sided cooling of FIG. 12 is approximately 120 mL. The devices and methods described herein enable a total volume of less than 240 mL for both electronic components 180 and electrical conductors 185 to enable achieving a power density of 100 kW/L. To put this in perspective, this would provide approximately 80% lower power density and 50% lower thermal resistance compared to similar systems of a 2014 Honda Accord Hybrid. The present disclosure also enables electrical connection cooling to decrease electronic components 180, such as capacitor and gate drivers, temperatures while evenly flowing fluid through 12 openings 120D. The present disclosure described herein enables top side cooling of the electronic components 180 (i.e., source-side cooling) which can remove heat at the heat generating side of the electronic components 180. This may be particularly useful for low thermally conductive devices (for example, $Ga_2O_3$).

FIG. 14 illustrates modeled temperatures for 12 electronic components 180 when using a system 200 for single-sided cooling in accordance with one or more aspects of the present disclosure. The 12 electronic components 180 were cooled using the prototype shown in FIG. 3. Heat flux was 718 W, the maximum temperature of any single electrical component 155 was 222° C., and the temperature variation between the electronic components 180 was 1.9° C. This shows the cooling effect is relatively uniform among the electronic components 180 within the system 200 for single-sided cooling.

Figure 15A:
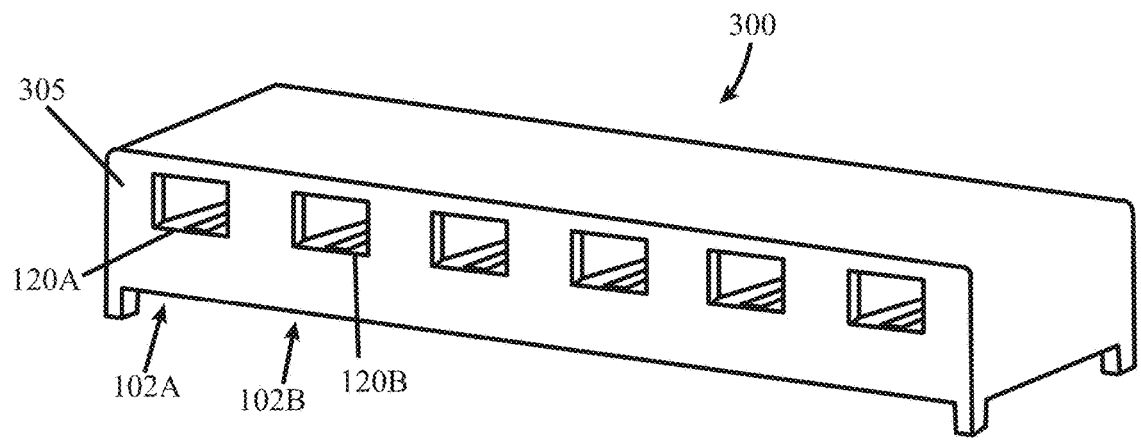
FIG. 15A illustrates a top orthogonal view and FIG. 15B illustrates a bottom orthogonal view of a multi-manifold tray for cooling power electronics in accordance with one or more aspects of the present disclosure.
Figure 15B:
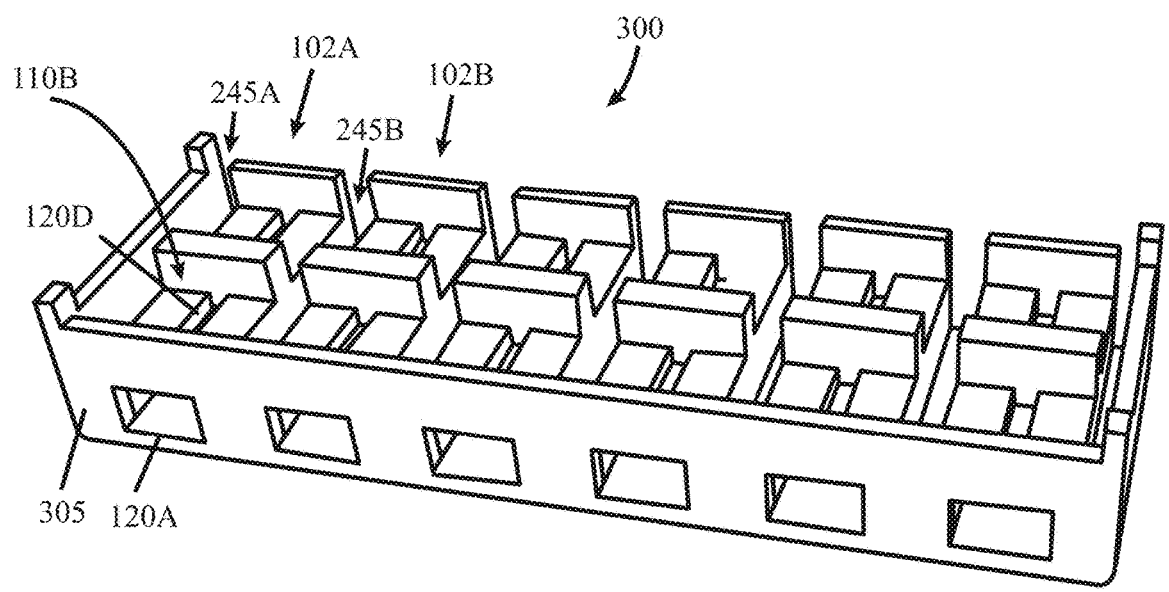

FIG. 15A illustrates a top orthogonal view and FIG. 15B illustrates a bottom orthogonal view of a multi-manifold tray 300 for cooling power electronics in accordance with one or more aspects of the present disclosure. The multi-manifold tray 300 is comprised of six individual devices 100A-F. Note that a multi-manifold tray 300 may be comprised of any number of individual blocks 102/devices 100, six is only used as an example here. A front face 305 of the multi-manifold tray 300 is the face with the opening 120A for the blocks 102 (shown as blocks 102A and 102B). The multi-manifold tray 300 may be placed in a larger housing (shown in FIGS. 16-18) in various configurations to cool multiple electronic components. In some embodiments, multiple multi-manifold trays 300 may be combined (as shown in FIGS. 16 and 18) to cool two sides of electronic components 180.

FIG. 15 illustrates multi-manifold tray 300 for use in the systems shown in FIGS. 16A-D and 17A-C. The multi-manifold tray 300 may direct fluid 160 flow into the opening 120D, thereby generating fluid jets that impinge the fluid 160 on electronic components 180. A multi-manifold tray 300 is may be made up of two or more blocks 102, arranged in parallel. That is, two or more blocks 102 (such as blocks 102A and 102B in FIG. 15A) may be arranged such that the opening 120A and 120B of each is oriented in the same direction, and fluid can flow into each block 102 simultaneously.

Figure 17:
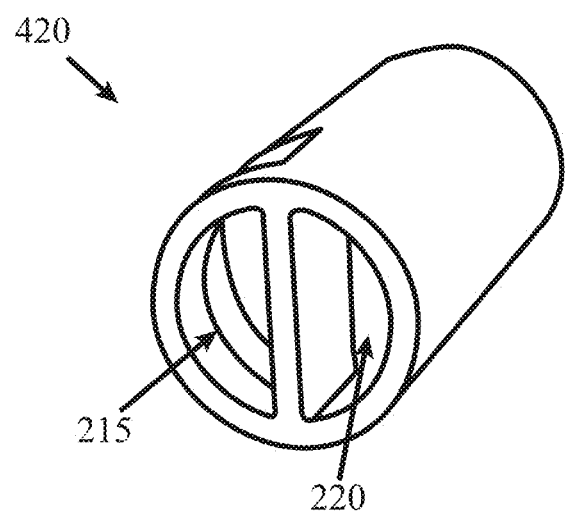
FIG. 17 illustrates an inlet/outlet tube for use in a system for double-sided cooling of power electronics with parallel fluid flow according to some embodiments of the present disclosure.
Figure 18A:
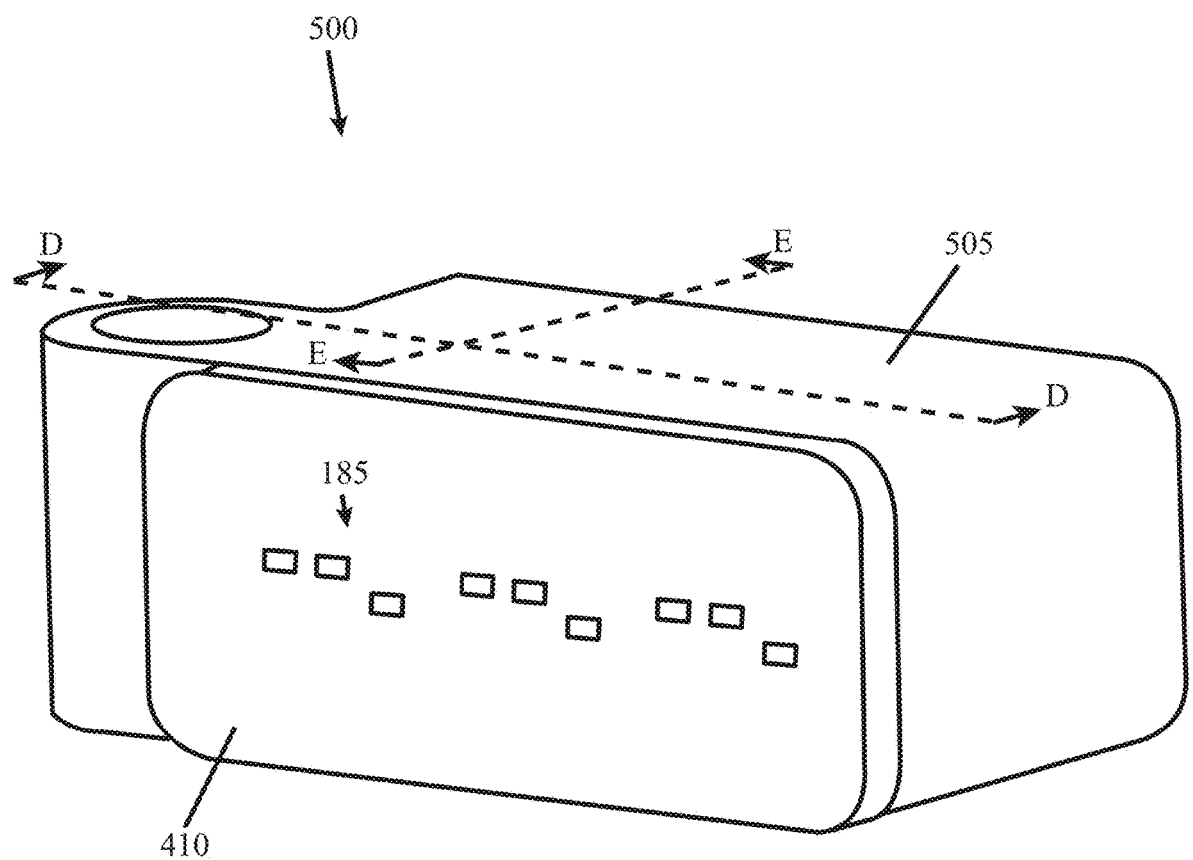
FIG. 18A illustrates an orthogonal view.
Figure 18B:
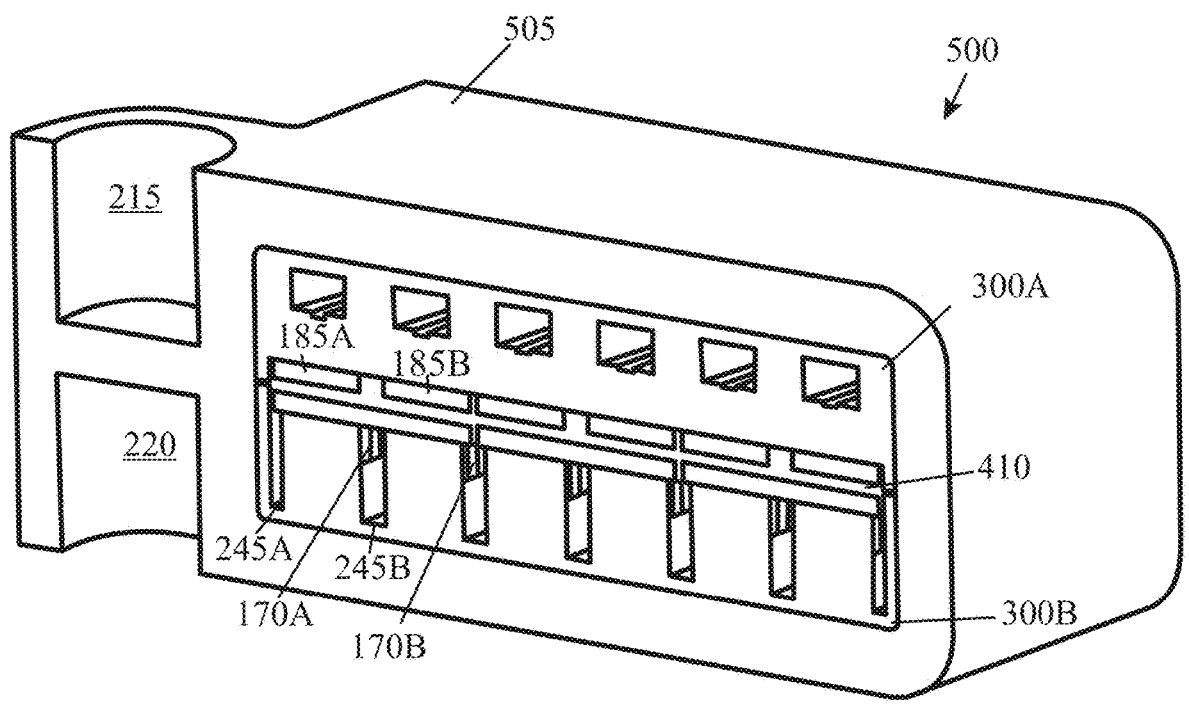
FIG. 18B illustrates a cross-section view cut along line D.
Figure 18C:
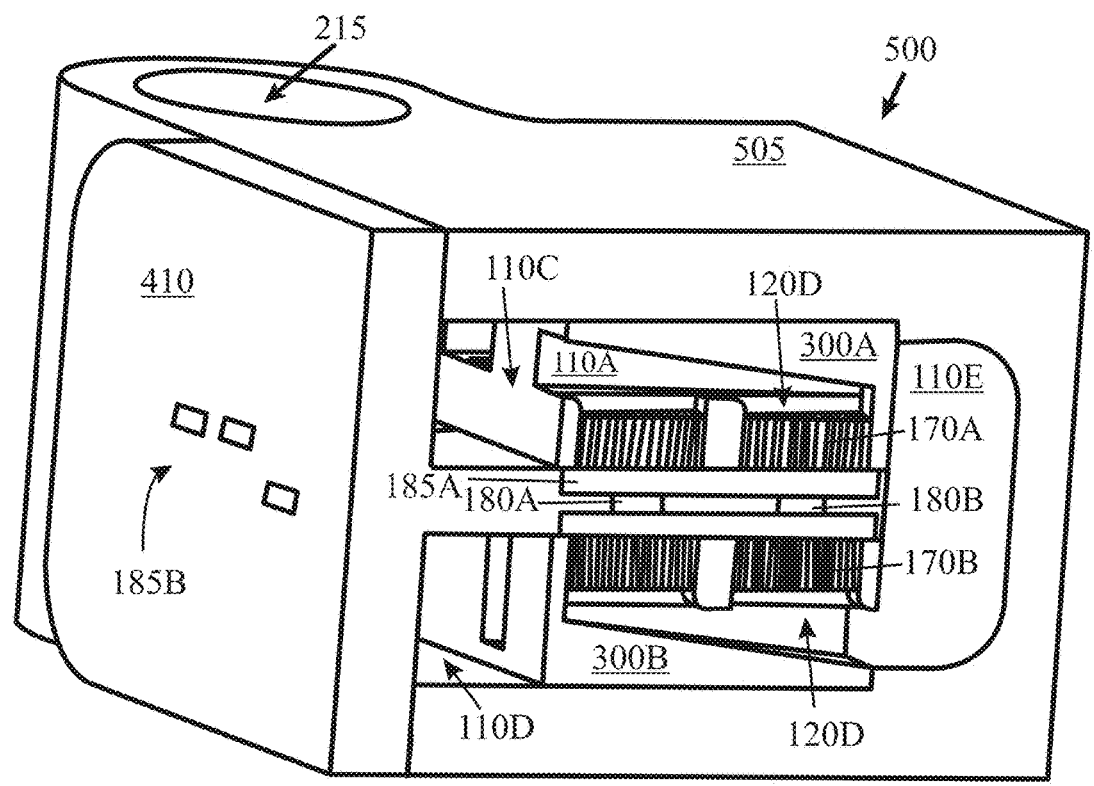
FIG. 18C illustrates a cross-section view cut along line E of a system for double-sided cooling of power electronics with fluid flow in series according to some embodiments of the present disclosure.

In some embodiments, two multi-manifold trays 300 may be used on both sides of the electronic components 180 and fluid 160 may be directed through openings 120D in both multi-manifold trays 300 to enable more efficient and faster cooling of the electrical components 180 (as shown in FIGS. 16 and 18). By providing cooling from both sides, such a system could reduce thermal resistance by approximately 50% due to double the cooled area. The cooling system may be configured for the fluid 160 to flow in parallel (as in FIG. 16A-D) or in series (as in FIGS. 18A-C). The systems as described in FIGS. 16-18 have an approximate total volume of 240 mL. The electronic components 180 to be cooled may be a part of a power electronics module 410 which can be sandwiched between two multi-manifold trays 300 and inserted into the front of a housing, as shown in FIGS. 16-18.

Figure 16A:
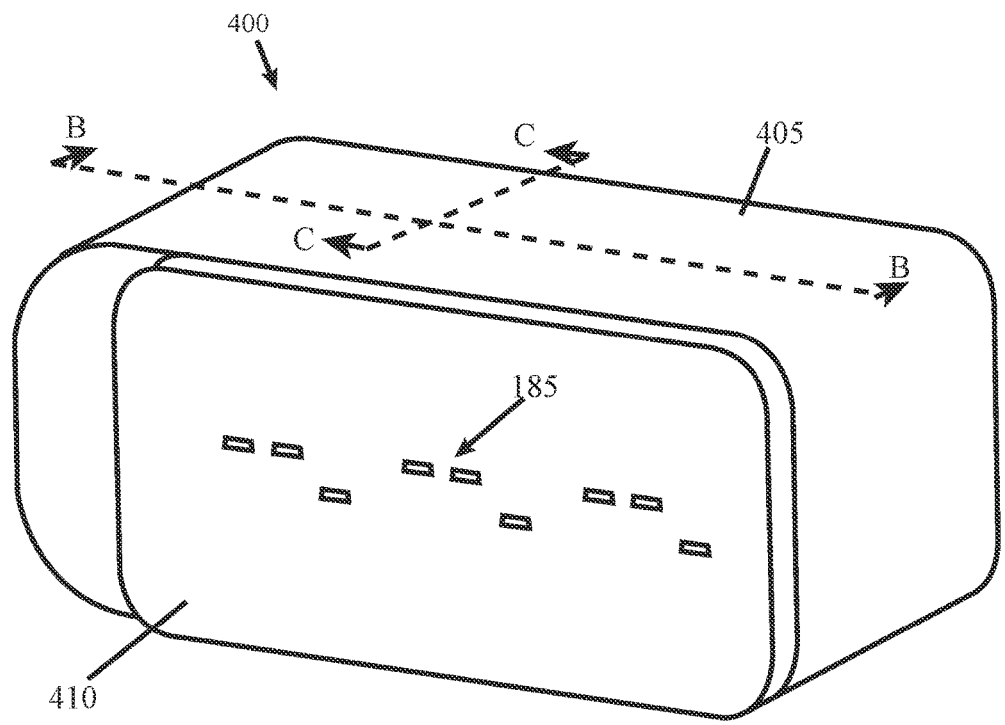
FIG. 16A illustrates an orthogonal view.
Figure 16B:
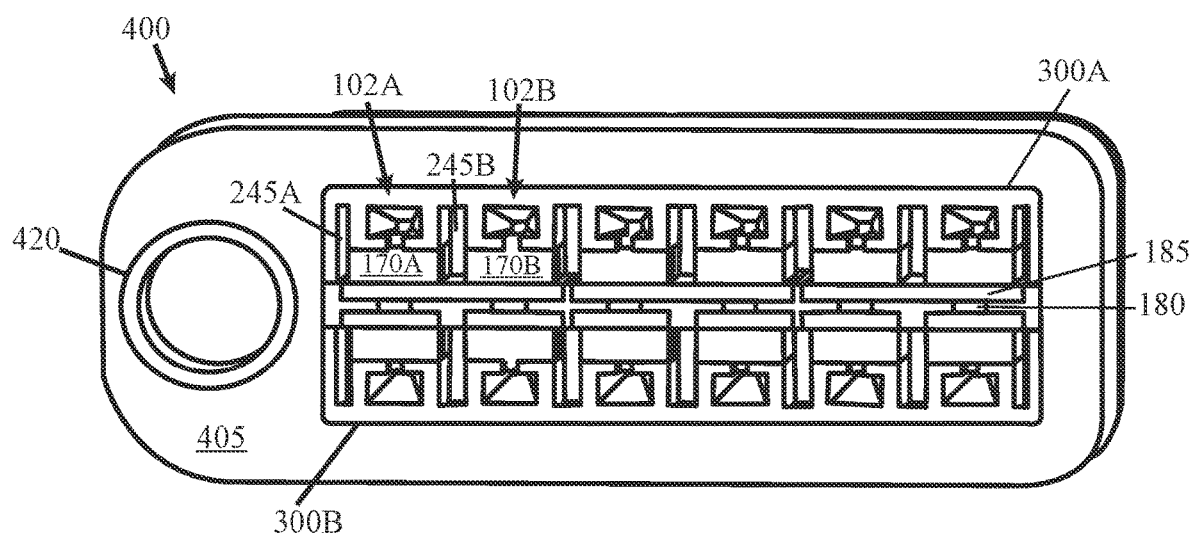
FIG. 16B illustrates a cross-sectional view cut along line B.
Figure 16C:
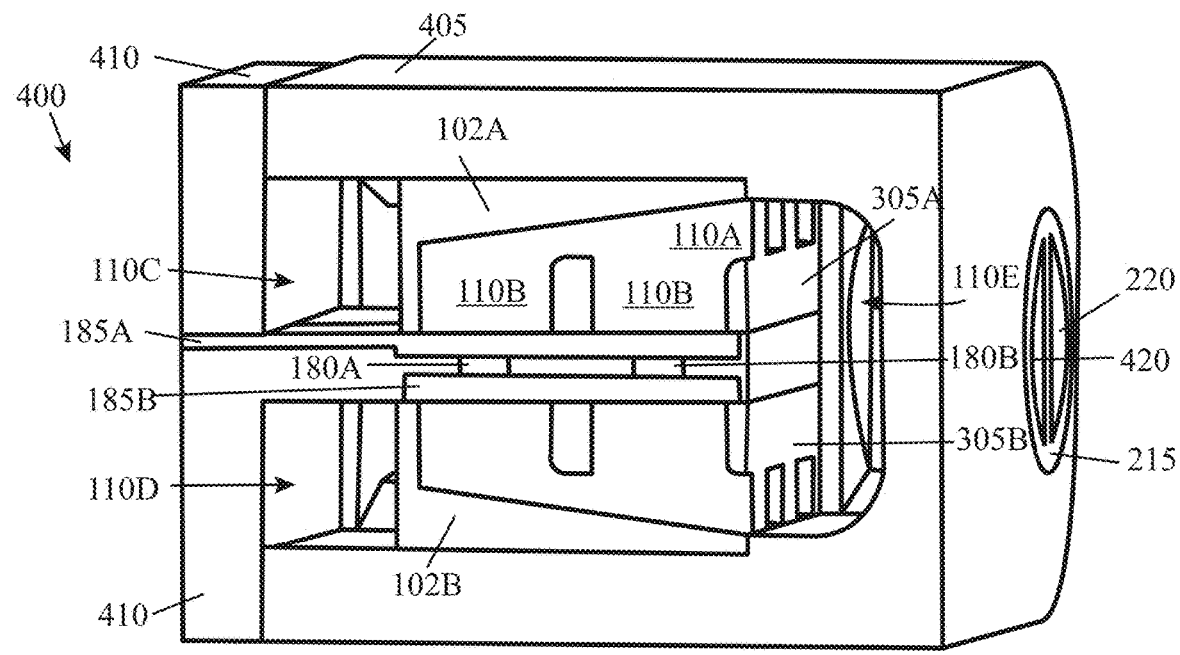
FIG. 16C illustrates a cross-sectional view cut along line C.
Figure 16D:
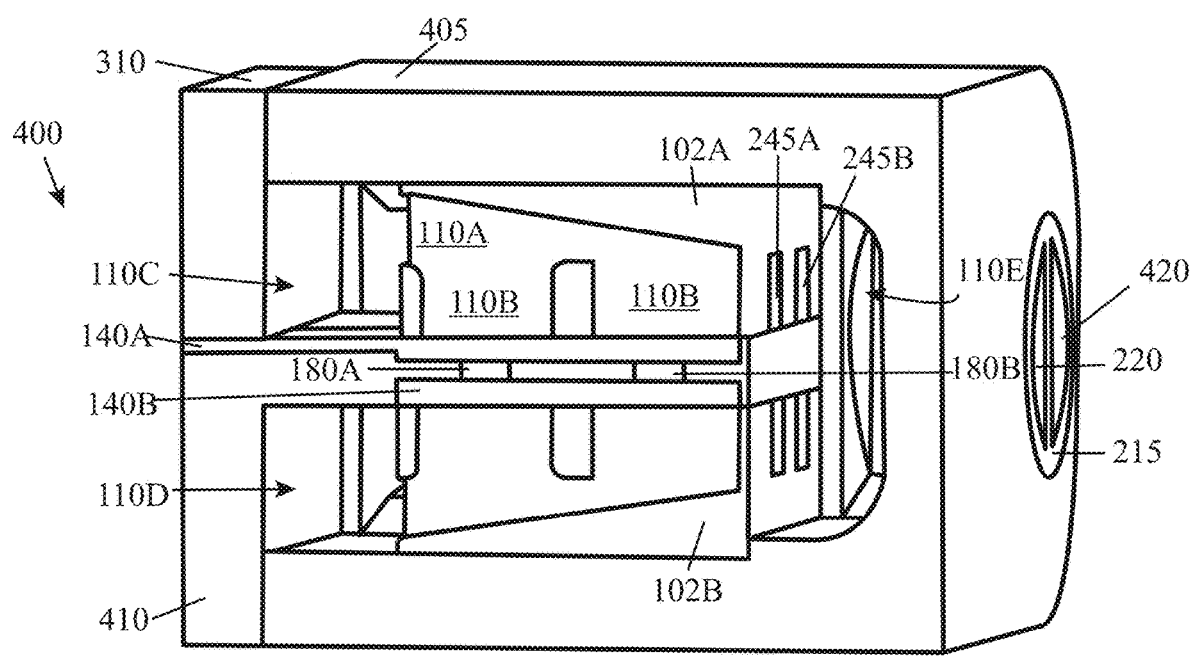
FIG. 16D illustrates an alternative cross-sectional view cut along line C of a system for double-sided cooling of power electronics with parallel fluid flow paths according to some embodiments of the present disclosure.

FIG. 16A illustrates an orthogonal view, FIG. 16B illustrates a cross-sectional view cut along line B, FIG. 16C illustrates a cross-sectional view cut along line C, and FIG. 16D illustrates an alternative cross-sectional view cut along line C of a system 400 for double-sided cooling with parallel fluid flow paths 400 according to some embodiments of the present disclosure.

FIG. 16A shows a housing 405 connected to a power electronics module 410. Electrical conductors 185 extend through the power electronics module 410. The power electronics module 410 fits over an opening in the housing 405 (not shown). The housing 410 may made of a solid or semi-solid material such as plastic, ceramic, metal, or a combination of materials. In this embodiment, the multi-manifold trays 300A and 300B (which may be plastic) are positioned for series flow. Note that the multi-manifold trays 300A and 300B can be reversed for flow in the opposite direction in other embodiments. A flange on the power electronics module 410 enables an O-ring or gasket seal to the housing 405 to protect from fluid 160 leaks. As described herein, fluid 160 may flow through the system of FIGS. 16A-D and over electrical connections (i.e., electrical conductors 185A-I) to help lower the temperature of the electronic components 180A-F, which may include capacitors and/or electrical boards.

FIG. 16A illustrates a system 400 for double-sided cooling with parallel flow as described by some embodiments herein. A single tube 420 may allow the dielectric fluid 150 to enter the housing 405.

FIG. 16B shows that inside the housing 305 there are two multi-manifold trays 300A and 300B oriented such that the openings 120D are directed towards electrical conductors 185A-I. The electrical conductors 185A-I sandwich the electronic components 180A-F. In between the individual devices 100A-L there are drainage channels 245A-N. A set of plates 170A-L extend from each respective electrical conductor 185A-I.

FIGS. 16C-D shows that the housing 405 and power electronics module 410 create a third channel 110C and a fourth channel 110D. In FIG. 16C, both faces 305A and 305B of the multi-manifold trays 300A and 300B are oriented towards the fifth channel 110E. In FIG. 16D, both faces 305A and 305B (not shown in FIG. 16D) of the multi-manifold trays 300A and 300B are oriented towards the third channel 110C and the fourth channel 110D. The system 400 for double-sided cooling with parallel fluid flow paths may have the multi-manifold trays 300A and 300B oriented such that the fluid 160 (not shown in FIGS. 16A-D) flows through the first channel 110A of each individual manifold 100 and is impinged on the electrical conductor 185A or 185B by flowing through the opening 120D. In FIG. 16C and FIG. 16D, the fluid 160 (not shown in FIGS. 16A-D) enters the housing 405 via the tube 420. The tube 420 is a cylindrical tube having a divider for separating an inlet 215 from an outlet 220 (i.e., separating fluid 160 flowing into the housing 405 from fluid 160 exiting the housing 405). In FIG. 16C, the fluid 160 first enters the fifth channel 110E then flows through the two multi-manifold trays 300A and 300B to impinge on the electrical conductors 185A and 185B then flows through drainage channels 245 (not shown in FIG. 16C) to either the third channel 110C or the fourth channel 110D. In FIG. 16D, the fluid 160 first enters the third channel 110C and the fourth channel 110D then flows through the multi-manifold trays 300A and 300B to impinge on the electrical conductors 185A and 185B then flows through drainage channels 245A-D to the fifth channel 110E. The fluid 160 flow in both FIG. 16C and FIG. 16D may be said to be parallel, in that the fluid 160 is flowing in the same direction through both multi-manifold trays 300A and 300B.

In FIGS. 16A-D, the fluid 160 will flow over electrical connections (i.e., the electrical conductors 185) on both the top and bottom of electronic components 180 to help lower temperatures of electrical components 180. Thus, in the example of FIG. 16C, fluid 160 flows across the electrical conductors 185A and 185B from the back (from the viewer's perspective in FIG. 16A) to the front of the housing 405, before exiting via the outlet 220. In the example of FIG. 16D, fluid 160 flows across the electrical conductors 185A and 185B from the front (from the viewer's perspective in FIG. 16A) to the back of the housing 405, before exiting via the outlet 220. Note that the difference between FIGS. 16C and 16D is that the multi-manifold trays 300A and 300B have been rotated (or "flipped"), altering the direction of the fluid 160 flow.

FIG. 17 illustrates a tube 420 for use in a system 400 for double-sided cooling with parallel fluid flow according to some embodiments of the present disclosure. The tube 420 may separate the inlet 215 and outlet 220 fluid paths. The fluid flow may be reversible (with reversal of the multi-manifold trays 300A and 300B, as necessary), so the tube's 420 ports (i.e., inlet 215 and outlet 220) may function as either an inlet 215 or an outlet 220. The fluid 160 may flow in via either the rear (i.e., further from the viewer) opening of the circular hole. The fluid 160 (not shown) may be directed over and contact both a first and second side of electronic components 180 of a module by multi-manifold trays 300A and 300B and then reach the front of the housing 405. Then the fluid 160 may flow out the outlet 220. In this configuration, the fluid flow is parallel because the fluid 160 collects heat from only one area of the electronic components 180 in a single flow through the system 400 for double-sided cooling with fluid flow in parallel. The tube 420 has a divider separating the inlet 215 and outlet 220.

FIG. 18A illustrates an orthogonal view, FIG. 18B illustrates a cross-section view cut along line D, and FIG. 18C illustrates a cross-section view cut along line E of a system 500 for double-sided cooling of power electronics with fluid flow in series according to some embodiments of the present disclosure. In FIGS. 18A-C, fluid 160 may directed over and contact a first side of an electronic components 180 (specifically, electrical conductor 185) by flowing through a first multi-manifold tray 300A to the third channel 450. Thereafter, the fluid 160 may flow to the other side of the electronic components 180 (specifically, an electrical conductor 185), directed by a second multi-manifold tray 300B, to remove heat from the other side of the electronic components 180. Then the fluid 160 may flow out the tube 420. In this configuration, the fluid flow path is serial (or in series) because the fluid 160 collects heat from more than one area of the electronic components 180 in a single flow through the system 500 for double-sided cooling with series flow.

FIG. 18A shows a housing 505 connected to a power electronics module 410. Electrical conductors 185 extend through the power electronics module 410. The power electronics module 410 fits over an opening in the housing 505 (not shown). The housing 510 may made of a solid or semi-solid material such as plastic, ceramic, metal, or a combination of materials.

FIG. 18B shows a cross section view cut along line D of the system 500 for double-sided cooling of power electronics with fluid flow in series according to some aspects of the present disclosure. The interior of the system 500 for double-sided cooling of power electronics with fluid flow in series includes an inlet 215 and outlet 220 on one side of a first multi-manifold tray 300A and a second multi-manifold tray 300B. The two multi-manifold trays 300A and 300B are oriented such that they sandwich the flange of power electronics module 410 between them. The power electronics module 410 includes a plurality of electrical conductors 185A-I. Plates 170A-F extend from the electrical conductors 185G, 185H, and 185I (note that plates extend from all of the electrical conductors, but only some are shown in FIG. 18B).

FIG. 18C shows a cross-section view cut along line E of the system 500 for double-sided cooling of power electronics with fluid flow in series according to some aspects of the present disclosure. A third channel 110C is positioned between the power electronics module 410, the housing 505, and the first multi-manifold tray 300A. A fourth channel 110D is positioned between the power electronics module 410, the housing 505, and the second multi-manifold tray 300B. A fifth channel 110E is on the opposite side of the housing 505 from the third channel 110C and the fourth channel 110D.

In FIGS. 18A-C, the two multi-manifold trays 300A and 300B are oriented such that the front of multi-manifold tray 300A is oriented towards the power electronics module 410 and the front of multi-manifold tray 300B is oriented towards the fifth channel 110E. The orientation of the two multi-manifold trays 300A and 300B results in fluid 160 (not shown) entering the housing 505 through the inlet 215 to the third channel 110C. The fluid 160 (not shown) then flows into the first channel 110A of the first multi-manifold tray 300A to openings 120D. The fluid 160 (not shown) is then impinged on electrical conductor 185A and drains through a drainage channel (not shown) to the fifth channel 110E. From there the fluid 160 (not shown) enters a first channel 110A of the second multi-manifold tray 300B to openings 120D. The fluid 160 (not shown) is then impinged on electrical conductor 185B and drains through a drainage channel 245A to the fourth channel 110D.

Shown in FIGS. 16A-D and 18A-D, some of the electrical conductors (such as electrical conductor 185A) extend into the third channel 110C. This results in electrical conductor 185A being in direct contact with the fluid 160 when the fluid 160 flows through the third channel 110C, and thus the electrical conductor 185A being cooled by the fluid 160 at that time.

As described herein, using a dielectric fluid as fluid 160 does not require a phase change, meaning it can be cheaper than typical phase-change fluids used for heat transfer purposes. The fluid 160 could even be transmission fluid, drive train fluid, drive line fluid, or other fluid already in use in the larger automotive system. Using a dielectric fluid allows the fluid 160 to be in direct contact with electrically active surfaces (i.e., electrical conductors 185 and/or the electronic components 180).

As described herein, the electronic components 180 may be cooled (in some instances using their connections, i.e., the electrical conductors 185) using the techniques described herein. A fluid 160, which is a dielectric fluid, may be used to cool the electronic components 180 by flowing across electrical connectors/terminals (i.e., electrical conductors 185A in the third channel 110A) to remove heat. Cooling the electrical conductors 185 enables operating the electronic components 180 at high temperatures (up to 250° C.) and limiting their thermal effects on other auxiliary electrical components. For example, capacitors and electrical boards are typically designed so they cannot safely exceed 100-125° C. Operating at high temperatures allows the cooling methods described herein to be good for wide-bandgap power electronics (SiC, GaN, $Ga_2O_3$) but it can also be used for lower temperature electronics (Si or other transistor materials) as the electronic components 180. The electrical conductors 185 are also the primary heat flow path between the electronic components 180 and thus this cooling approach allows for compact packaging (i.e., housing 405 or 505).

In some embodiments, the present disclosure includes a compact (approximately 240 mL in volume) housing 405 or 505 that enables a leak-tight system for cooling/immersing a power electronics module 410 with fluid 160. The entire power electronics module 410 and multi-manifold trays 300A and 300B fit within the housing 405 or 505. Such system 400 or 500 is versatile and can be configured in multiple series and/or parallel flow configurations.

In some embodiments, the housing 410 or 510 may be coated with metal for electromagnetic interference (EMI) mitigation. This may also be beneficial for electronic components 180 with wide bandgap high-switching applications. The present disclosure allows for cooling of the electrical conductors (e.g., electrical interconnects/bus bars) to reduce heat load from the modules to the electronic components (e.g., the capacitors and electrical boards).

Example 1. A device comprising:
- a block comprising a length in the x-axis direction, a width in the y-axis direction, and a height in the z-axis direction;
- a first channel comprising a first opening;
- a second channel comprising a second opening and a third opening; and
- a fourth opening; wherein:
- the length and the width define a first surface and a second surface of the block,
- the length and the height define a third surface and a fourth surface of the block,
- the width and the height define a fifth surface and a sixth surface of the block,
- the first channel is positioned within the first surface and penetrates the block in the x-axis direction to a first depth, and penetrates the block in the z-axis direction to a second depth,
- the second channel is positioned within the second surface, passes through the block from the third surface to the fourth surface, and penetrates the block in the z-axis direction to a third depth,
- the fourth opening is configured to connect the first channel and the second channel,
- the first channel is configured to direct a fluid from the first opening to the fourth opening, and
- the second opening and the third opening are configured to receive the fluid from the fourth opening.

Example 2. The device of Example 1, wherein:
- the first depth is less than the length of the block
- the first channel terminates at the first depth at a second width,
- the first channel has a third width in the y-axis direction at the first opening, and
- the second width of the first channel is less than the third width of the first channel.

Example 3. The device of Example 1, further comprising:
- a plate positioned within the second channel, wherein:
- the plate comprises a second height and a second width defining a plane,
- the plane is positioned substantially parallel to the third surface,
- the width of the plate is substantially equal to the width of the block,
- the height of the plate is substantially equal to the third depth.

Example 4. The device of Example 3, wherein the plate is comprised of copper.

Example 5. The device of Example 3, wherein:
- the plate is connected to an electrical conductor, and
- the electrical conductor is soldered to an electronic component.

Example 6. The device of Example 3, wherein:
- the second channel has a fourth width in the x-axis direction, and
- the fourth width of the second channel is less than the length of the block.

Example 7. The device of Example 1, wherein the fourth opening comprises two or more openings aligned in series along the x-axis.

Example 8. The device of Example 1, wherein the first opening has a cross-sectional shape that is substantially square or rectangular.

Example 9. The device of Example 1, wherein the second opening has a cross-sectional shape that is substantially square or rectangular.

Example 10. The device of Example 1, wherein the third opening has a cross-sectional shape that is substantially square or rectangular.

Example 11. The device of Example 1, wherein the first channel has a cross-sectional shape in a plane substantially parallel to the first surface that is substantially triangular.

Example 12. The device of Example 1, wherein the first depth is between 10 and 70 mm.

Example 13. The device of Example 1, wherein the second depth is between 1 and 5 mm.

Example 14. The device of Example 1, wherein the third depth is between 3 and 5 mm.

Example 15. The device of Example 1, wherein the width (W) and the height (H) form an aspect ratio W/H between 1 and 1.5.

Example 16. The device of Example 1, wherein the width (W) and the length (L) form an aspect ratio L/W between 2 and 5.

Example 17. The device of Example 1, wherein the block is constructed of at least one of plastic, ceramic, aluminum, and/or stainless steel.

Example 18. A system comprising:
- a first block;
- a second block;
- a housing configured to contain the first block and the second block and comprising:
- an inlet;
- an outlet;
- a third channel connected to the inlet;
- a fourth channel connected to the inlet; and
- a fifth channel connected to the outlet;
- wherein:
- a power electronics module comprising a first electrical conductor and a second electrical conductor is positioned between the first block and the second block;
- the fluid is configured to enter the housing through the inlet;
- the first electrical conductor extends into the third channel, and
- the first electrical conductor is configured to contact the fluid in the third channel.

Example 19. The system of Example 18, wherein:
- the first block and the second block comprise:
  - a length in the x-axis direction, a width in the y-axis direction, and a height in the z-axis direction;
  - a first channel comprising a first opening;
  - a second channel comprising a second opening and a third opening; and
  - a fourth opening; wherein:
  - the length and the width define a first surface and a second surface of the block,
  - the length and the height define a third surface and a fourth surface of the block,
  - the width and the height define a fifth surface and a sixth surface of the block, the first channel is positioned within the first surface and penetrates the block in the x-axis direction to a first depth, and penetrates the block in the z-axis direction to a second depth, the second channel is positioned within the second surface, passes through the block from the third surface to the fourth surface, and penetrates the block in the z-axis direction to a third depth, the fourth opening is configured to connect the first channel and the second channel, the first channel is configured to direct a fluid from the first opening to the fourth opening, and the second opening and the third opening are configured to receive the fluid from the fourth opening.

Example 20. The system of Example 19, wherein:

the fluid is configured to impinge on the first plate through the fourth opening of the first block;

the fluid is configured to impinge on the second plate through the fourth opening of the second block the fluid is configured to drain through the second opening and the third opening of the first block to a first drainage channel, the fluid is configured to drain through the second opening and the third opening of the second block to a second drainage channel.

Example 21. The system of Example 18, further comprising:

an inlet channel configured to connect the inlet to the third channel and the fourth channel, and an outlet channel configured to connect the outlet to the fifth channel, wherein:

the inlet channel is negatively sloped.

Example 22. The system of claim 18, wherein:

the first block is oriented such that the first opening is connected to the third channel, and the second block is oriented such that the first opening is connected to the fourth channel.

Example 23. The system of claim 19, wherein:

the fluid is configured to flow from the inlet to the third channel and the fourth channel, the fluid is configured to enter the first opening of the first block and the second block and impinge on the first plate and the second plate, and the fluid is configured to exit the first block and the second block to the fifth channel.

Example 24. The system of claim 18, wherein:

the first block is oriented such that the first opening connected to the third channel, and the second block is oriented such that the first opening is connected to the fifth channel.

Example 25. The system of Example 22, wherein:

the fluid is configured to:

flow from the inlet to the third channel, enter the first opening of the first block and impinge on the first plate, exit the first drainage channel to the fifth channel, enter the first opening of the second block and impinge on the second plate, exit the second drainage channel to the fourth channel, and flow from the fourth channel to the outlet.

Example 26. The system of claim 18, wherein the fluid is a dielectric fluid.

Example 27. The system of Example 26, wherein the dielectric fluid is an automotive transmission fluid, a driveline fluid, a hydraulic fluid, or a motor oil.

Example 28. The system of Example 18, wherein:

the first block, the second block, and the housing comprise a material, the material is configured to reduce electromagnetic interference, and the material is aluminum, copper, steel, or an alloy thereof.

Example 29. The system of claim 28, further comprising:

a flange connected to the power electronics module and positioned substantially perpendicular from the first plate and the second plate; wherein:

the housing comprises an opening, the flange comprises an edge and a surface, the flange is configured to be positioned within the opening, such that the surface is substantially parallel with the opening, and the edge is in contact with the opening creating a fluid seal, wherein:

the fluid seal comprises at least one of a gasket or an O-ring positioned between the edge and the opening.

Example 30. A method comprising:

directing a fluid to flow into a block, the block comprising:

a length in the x-axis direction, a width in the y-axis direction, and a height in the z-axis direction;

a first channel comprising a first opening;

a second channel comprising a second opening and a third opening; and a fourth opening; wherein:

the length and the width define a first surface and a second surface of the block, the length and the height define a third surface and a fourth surface of the block, the width and the height define a fifth surface and a sixth surface of the block, the first channel is positioned within the first surface and penetrates the block in the x-axis direction to a first depth, and penetrates the block in the z-axis direction to a second depth, the second channel is positioned within the second surface, passes through the block from the third surface to the fourth surface, and penetrates the block in the z-axis direction to a third depth, the fourth opening is configured to connect the first channel and the second channel, and impinging the fluid on an electronics component, the electronics component comprising:

a plate positioned substantially perpendicular to the fourth opening, an electrical conductor positioned substantially perpendicularly to the plate, a heat source soldered to the electrical conductor; wherein:

the first channel is configured to direct the fluid from the first opening to the fourth opening, the electronics component is configured to be positioned within the second channel, the fourth opening has a center, the plate has a midpoint, and the plate is positioned such that the midpoint is aligned with the center.

Example 30. The method of Example 29, wherein:

the second opening and the third opening are configured to receive the fluid from the fourth opening.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

The invention claimed is:

1. A device comprising:
a block comprising a length in the x-axis direction, a width in the y-axis direction, and a height in the z-axis direction;
a first channel comprising a first opening;
a second channel comprising a second opening and a third opening; and
a fourth opening; wherein:
the length and the width define a first surface and a second surface of the block,
the length and the height define a third surface and a fourth surface of the block,
the width and the height define a fifth surface and a sixth surface of the block,
the first channel is positioned within the first surface and penetrates the block in the x-axis direction to a first depth, and penetrates the block in the z-axis direction to a second depth,
the second channel is positioned within the second surface, passes through the block from the third surface to the fourth surface, and penetrates the block in the z-axis direction to a third depth,
the fourth opening is configured to connect the first channel and the second channel,
the first channel is configured to direct a fluid from the first opening to the fourth opening, and
the second opening and the third opening are configured to receive the fluid from the fourth opening.

2. The device of claim 1, wherein:
the first depth is less than the length of the block
the first channel terminates at the first depth at a second width,
the first channel has a third width in the y-axis direction at the first opening, and
the second width of the first channel is less than the third width of the first channel.

3. The device of claim 1, further comprising:
a plate positioned within the second channel, wherein:
the plate comprises a second height and a second width defining a plane,
the plane is positioned substantially parallel to the third surface,
the width of the plate is substantially equal to the width of the block,
the height of the plate is substantially equal to the third depth.

4. The device of claim 1, wherein the fourth opening comprises two or more openings aligned in series along the x-axis.

5. The device of claim 1, wherein the first channel has a cross-sectional shape in a plane substantially parallel to the first surface that is substantially triangular.

6. The device of claim 1, wherein the first depth is between 10 and 70 mm.

7. The device of claim 1, wherein the second depth is between 1 and 5 mm.

8. The device of claim 1, wherein the third depth is between 3 and 5 mm.

9. The device of claim 1, wherein the width (W) and the height (H) form an aspect ratio W/H between 1 and 1.5.

10. The device of claim 1, wherein the width (W) and the length (L) form an aspect ratio L/W between 2 and 5.

11. The device of claim 1, wherein the block is constructed of at least one of plastic, ceramic, aluminum, and/or stainless steel.

* * * * *